(12) United States Patent
Ishikawa et al.

(10) Patent No.: US 7,123,417 B2
(45) Date of Patent: *Oct. 17, 2006

(54) METHOD OF FORMING AN IMAGE

(75) Inventors: Hiromi Ishikawa, Kaisei-machi (JP); Kazuhiko Nagano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/057,142

(22) Filed: Feb. 15, 2005

(65) Prior Publication Data
US 2005/0147138 A1 Jul. 7, 2005

Related U.S. Application Data

(63) Continuation of application No. 10/671,833, filed on Sep. 29, 2003, now Pat. No. 6,876,494.

(30) Foreign Application Priority Data

Sep. 30, 2002 (JP) .............................. 2002-287631
Sep. 30, 2002 (JP) .............................. 2002-287639

(51) Int. Cl.
G02B 27/00 (2006.01)
G02B 26/00 (2006.01)
G02B 13/22 (2006.01)
G03B 27/54 (2006.01)
F21S 8/00 (2006.01)

(52) U.S. Cl. ...................... 359/618; 359/237; 359/663; 359/619; 355/67; 362/268

(58) Field of Classification Search ........ 359/619–624, 359/237, 238, 663, 290–292, 626, 633; 355/67; 362/268
See application file for complete search history.

(56) References Cited

U.S. PATENT DOCUMENTS

| | | | |
|---|---|---|---|
| 5,022,087 A | 6/1991 | Peppers et al. | |
| 5,534,704 A | 7/1996 | Robinson et al. | |
| 5,936,774 A | 8/1999 | Street | |
| 6,809,873 B1 | 10/2004 | Cobb | |
| 6,876,494 B1 * | 4/2005 | Ishikawa et al. ............ | 359/618 |
| 2004/0109216 A1 | 6/2004 | Nakaya et al. | |
| 2004/0223129 A1 | 11/2004 | Ishikawa et al. | |
| 2004/0223229 A1 | 11/2004 | Ishikawa | |

FOREIGN PATENT DOCUMENTS

JP 2001-21830 A 1/2001
JP 2001-305663 A 11/2001

* cited by examiner

Primary Examiner—Loha Ben
Assistant Examiner—Jack Dinh
(74) Attorney, Agent, or Firm—Sughrue Mion, PLLC

(57) ABSTRACT

In a method of forming an image, pixel portions of a spatial light-modulation element are two-dimensionally arranged, and individually modulated portions of light are applied to the spatial light-modulation element, according to control signals. A first image-forming optical system is arranged in optical paths of the portions of the light modulated by the pixel portions, a microlens array is arranged in a vicinity of an image-forming plane of the first image-forming optical system, and has microlenses arranged in correspondence with the pixel portions, respectively. A second image-forming optical system is arranged in optical paths of the portions of the light which have passed through the microlenses, and forms, on a predetermined surface, an image represented by the portions of the light modulated by the spatial light-modulation element. Each of the first and second image-forming optical systems forms an image with a magnification power greater than one.

17 Claims, 28 Drawing Sheets

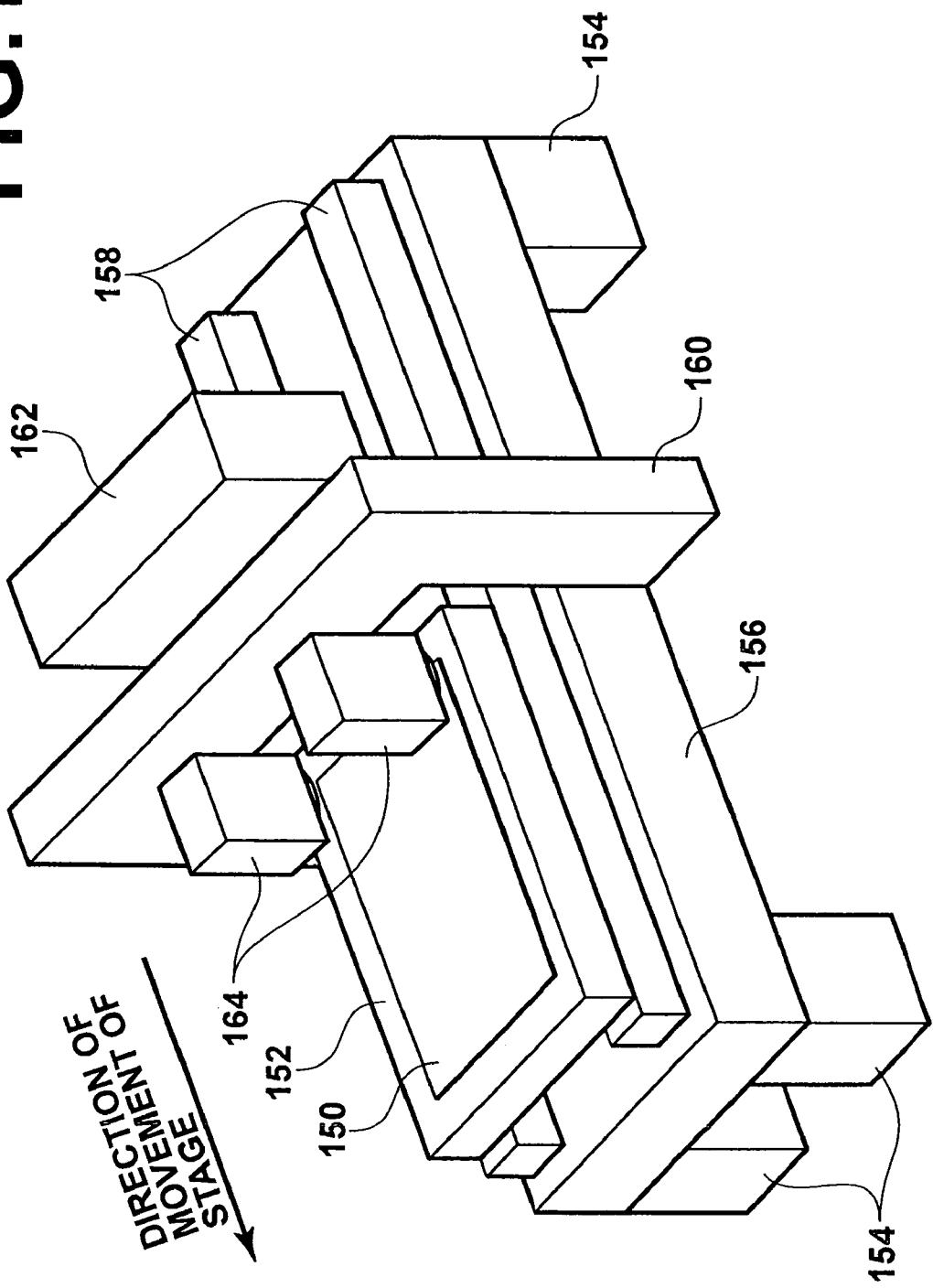

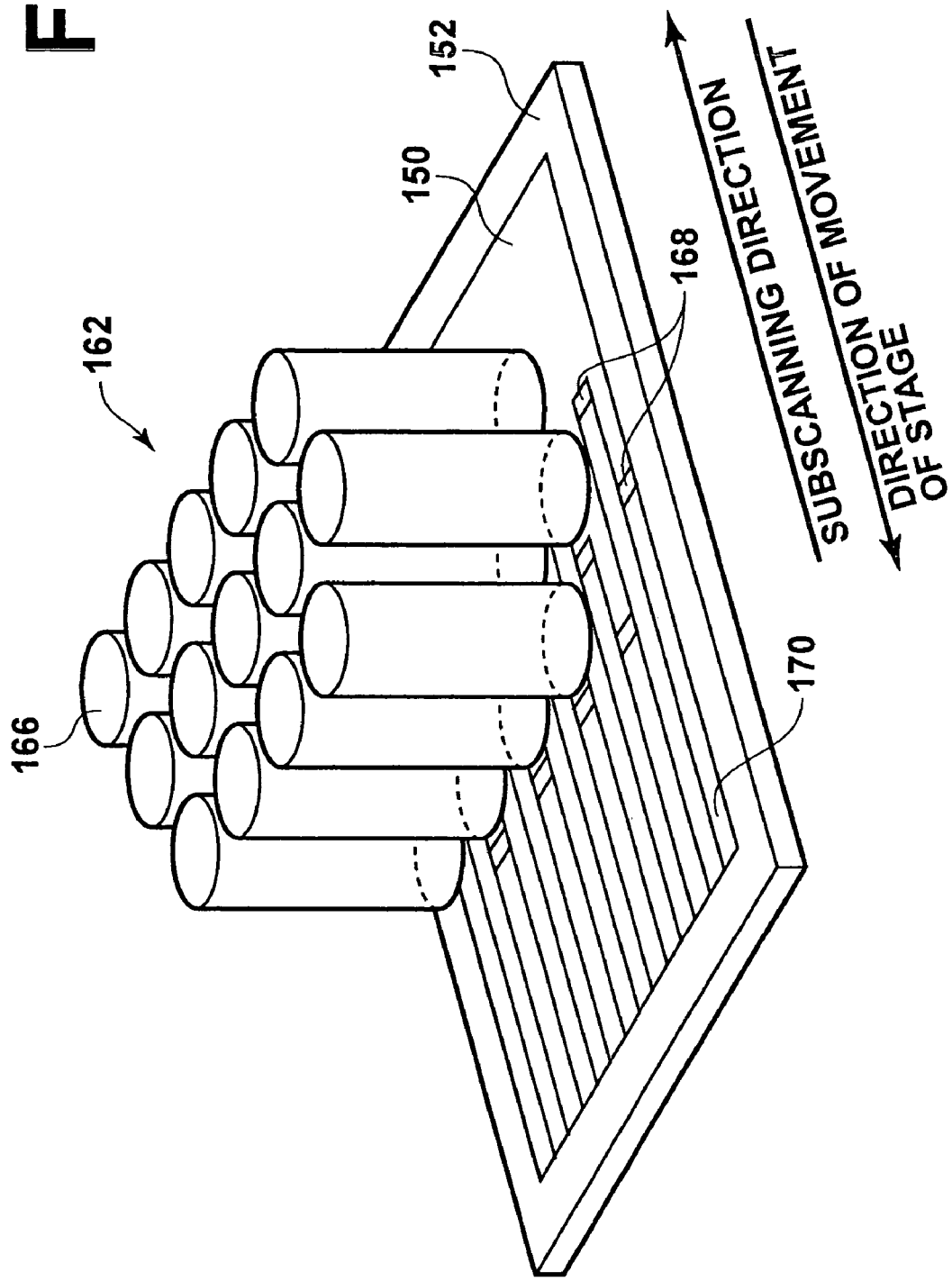

EXPOSED AREAS

SUBSCANNING DIRECTION SINGLE SCANNING AT LOW CONSTANT SPEED mROWS nCOLUMNS

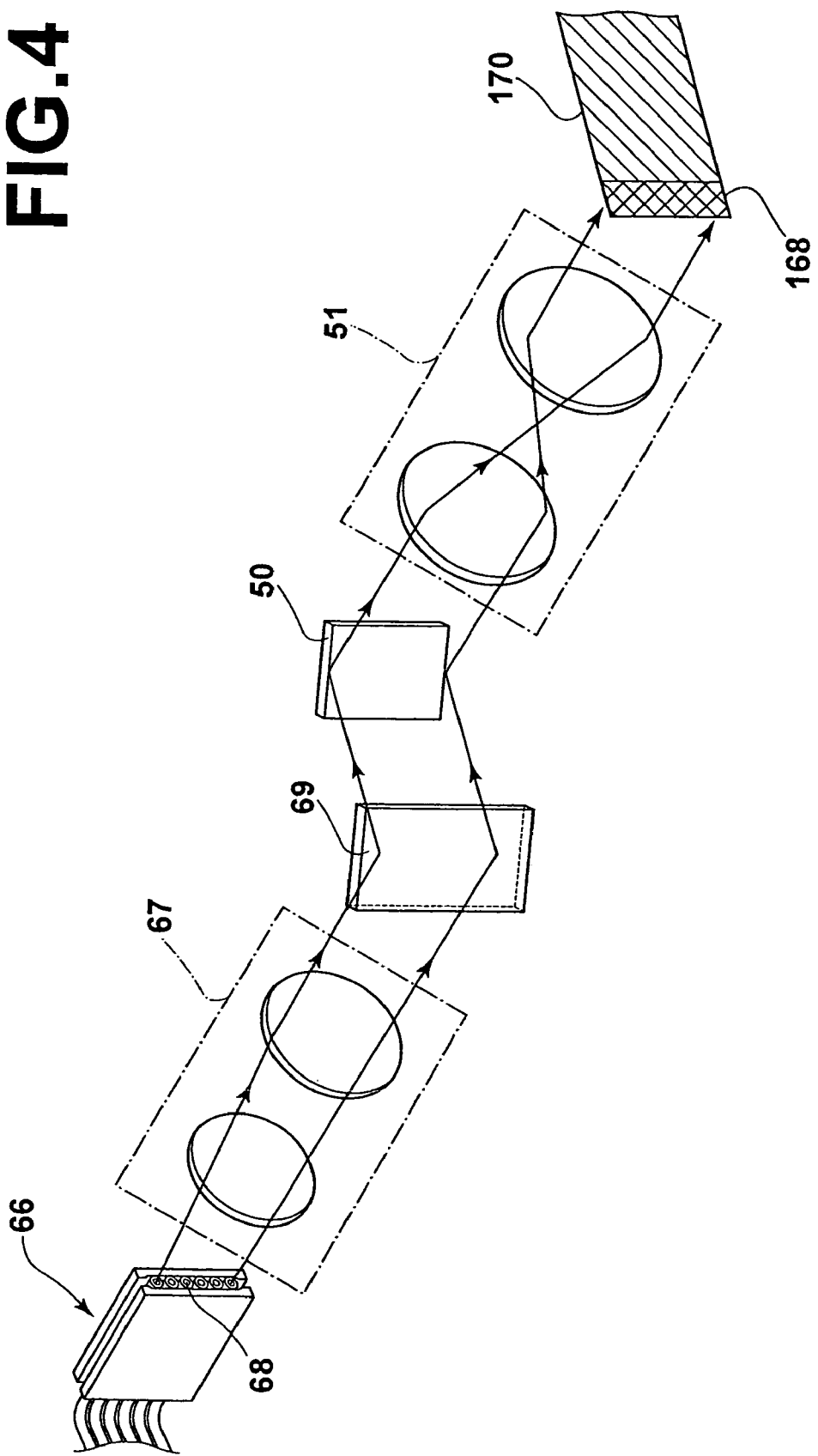

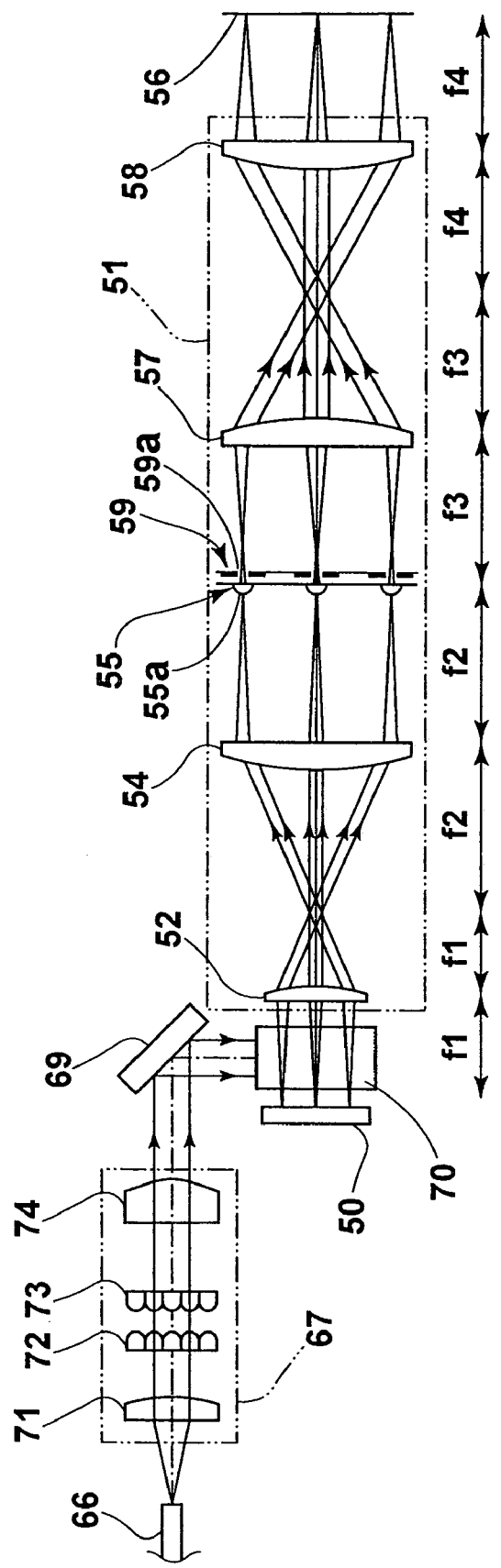

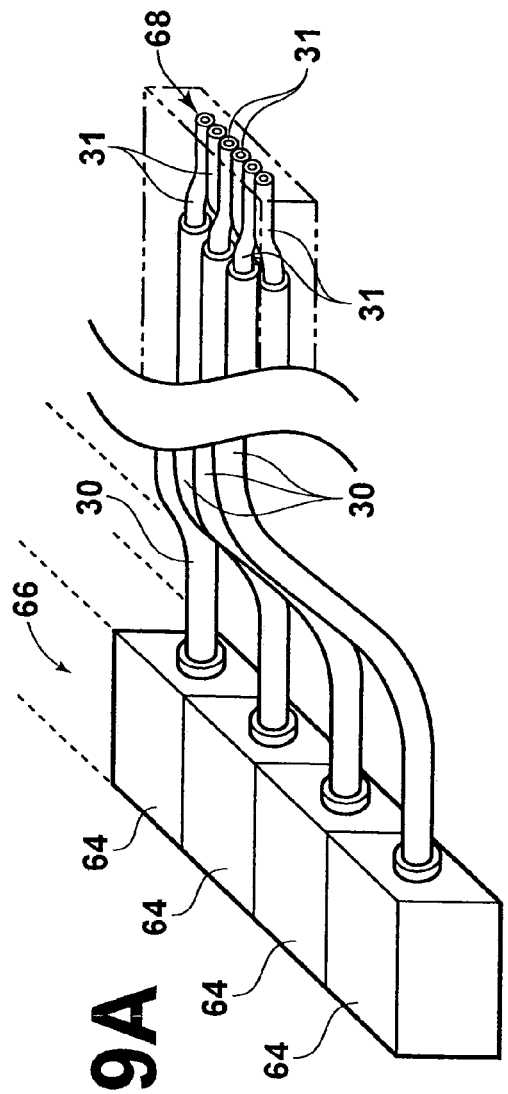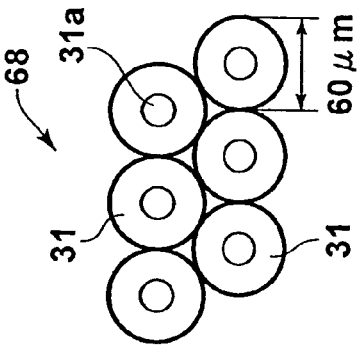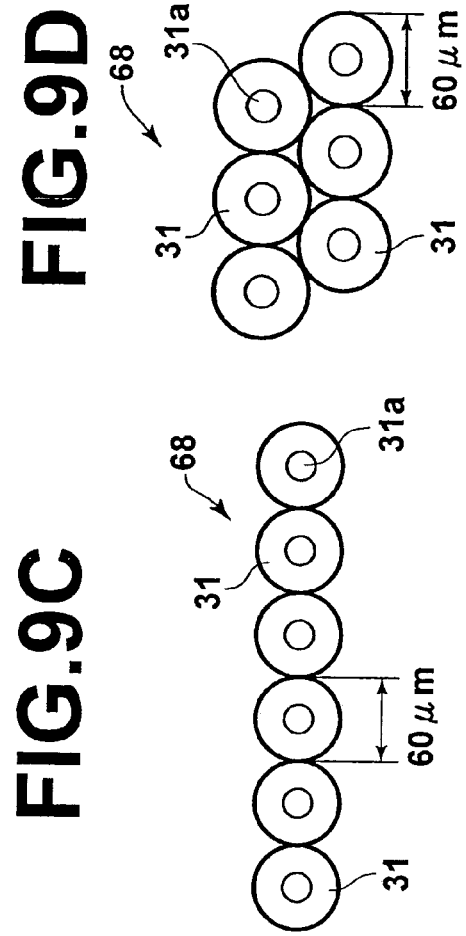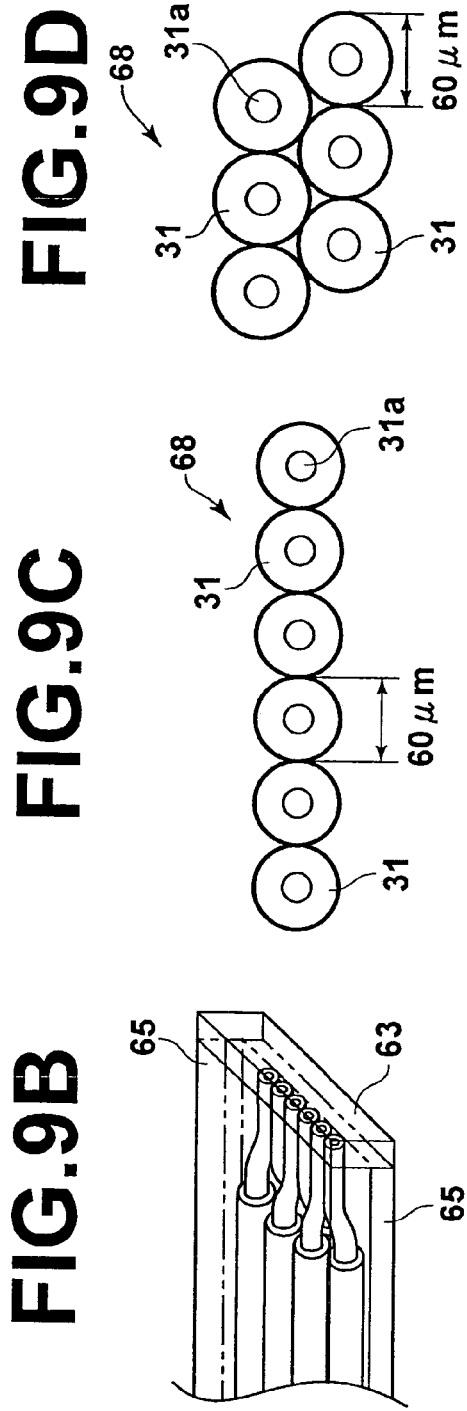

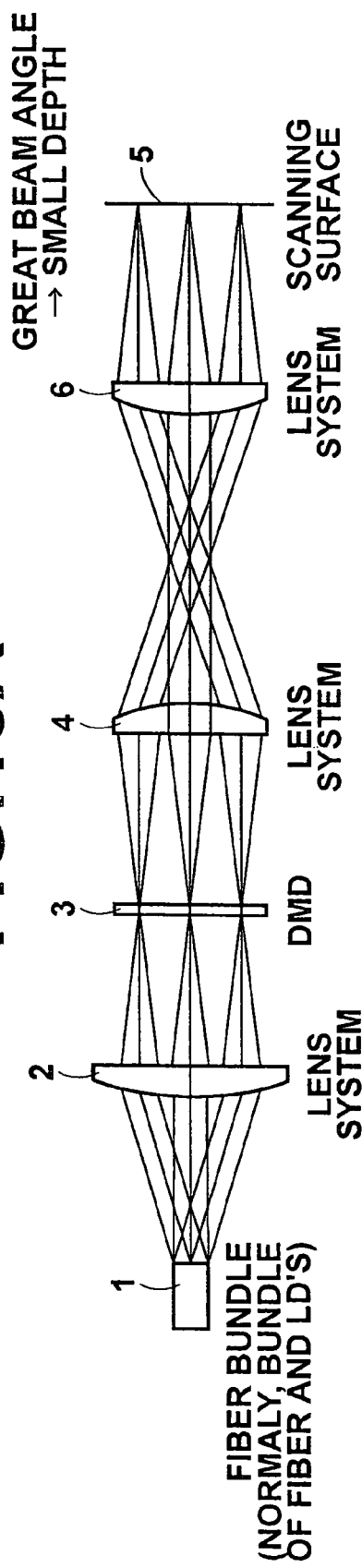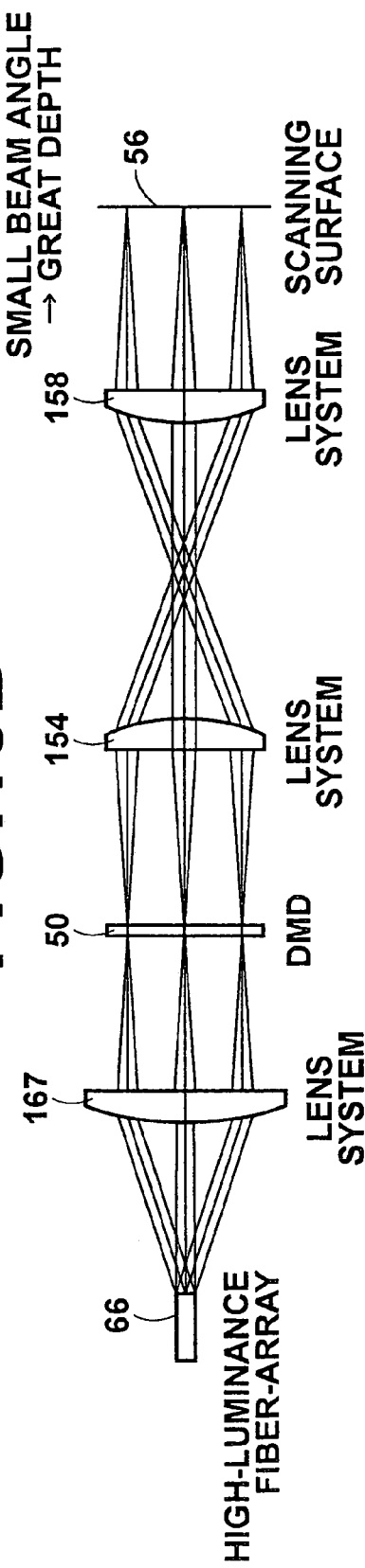

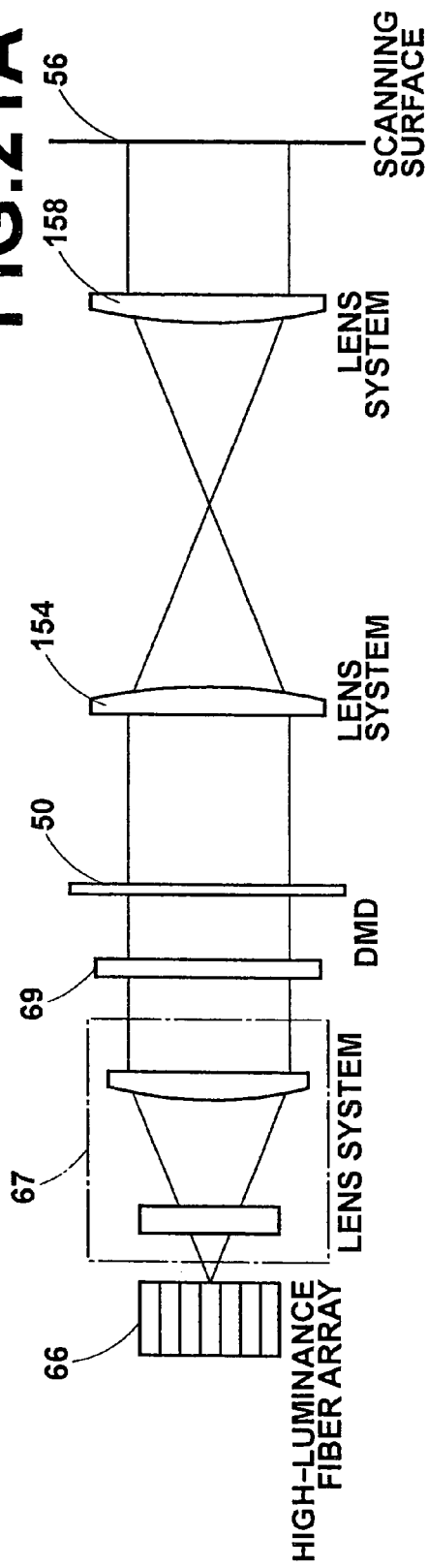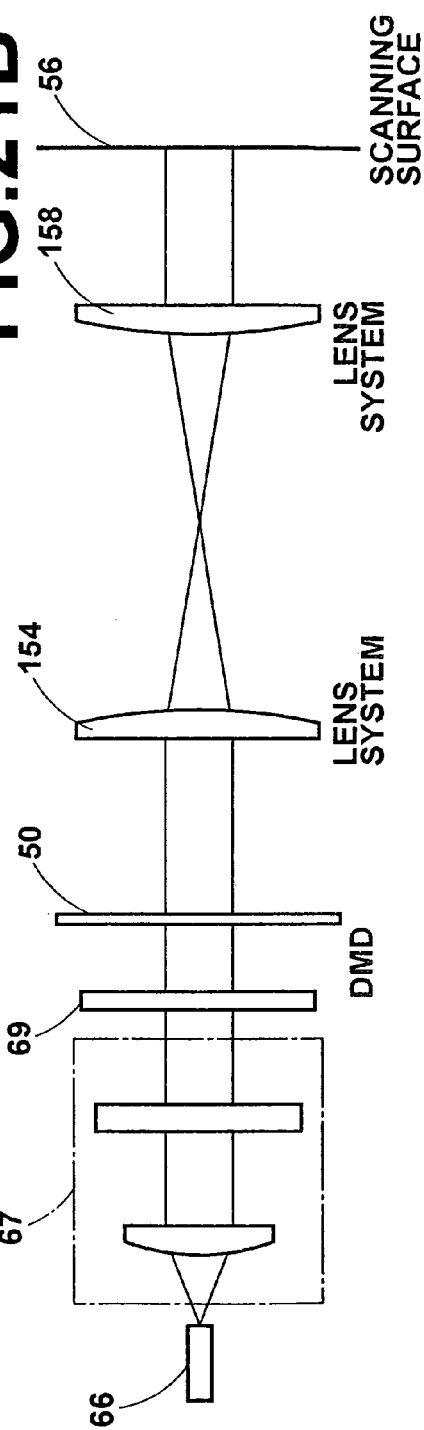

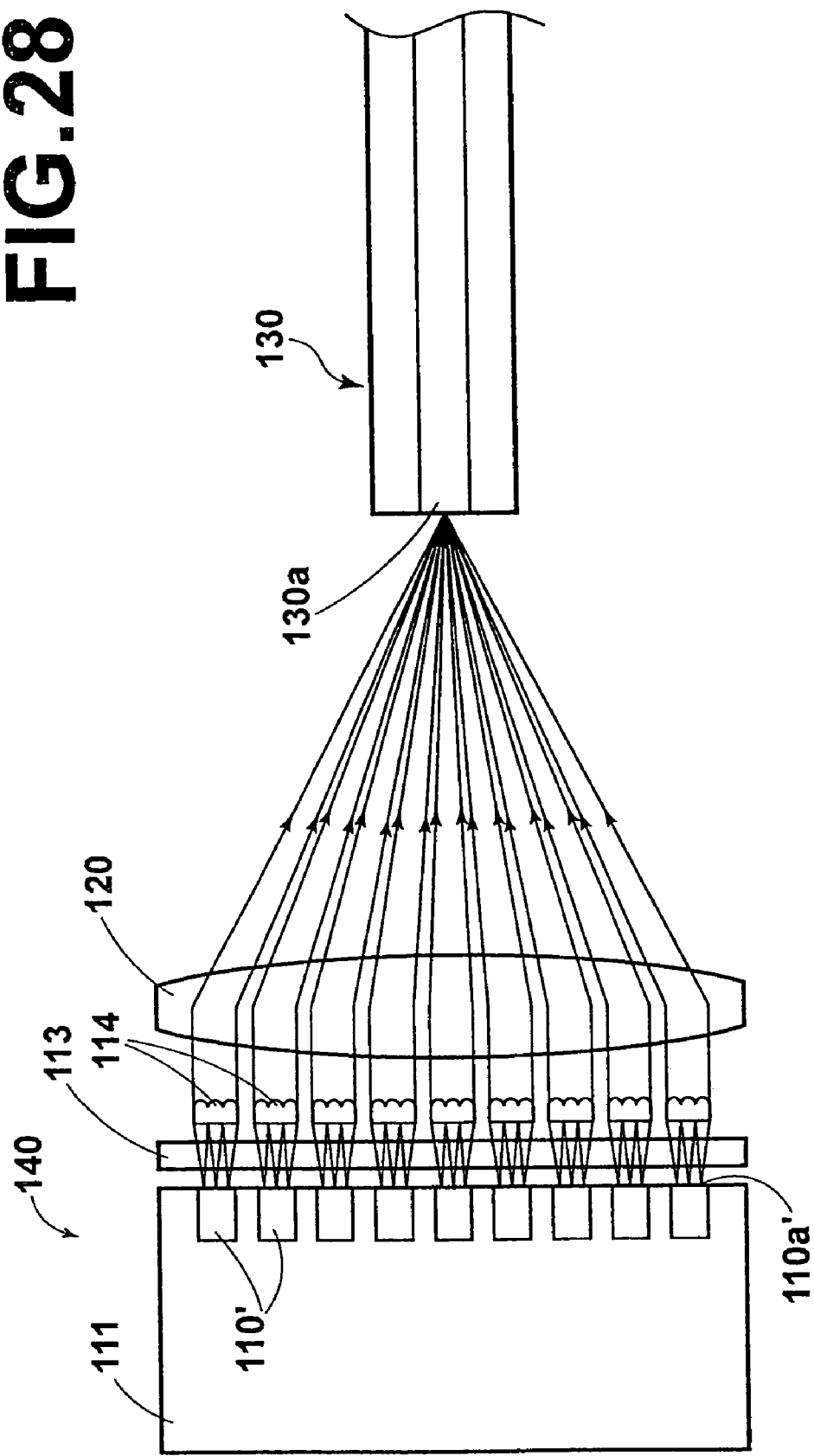

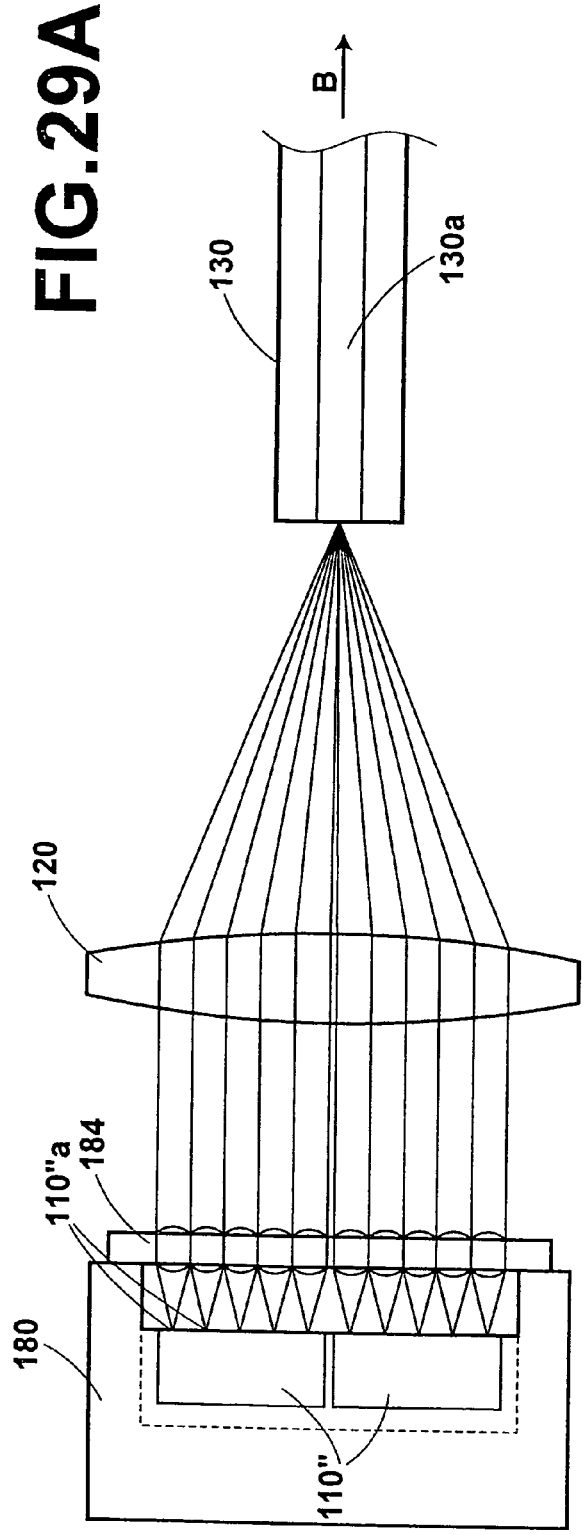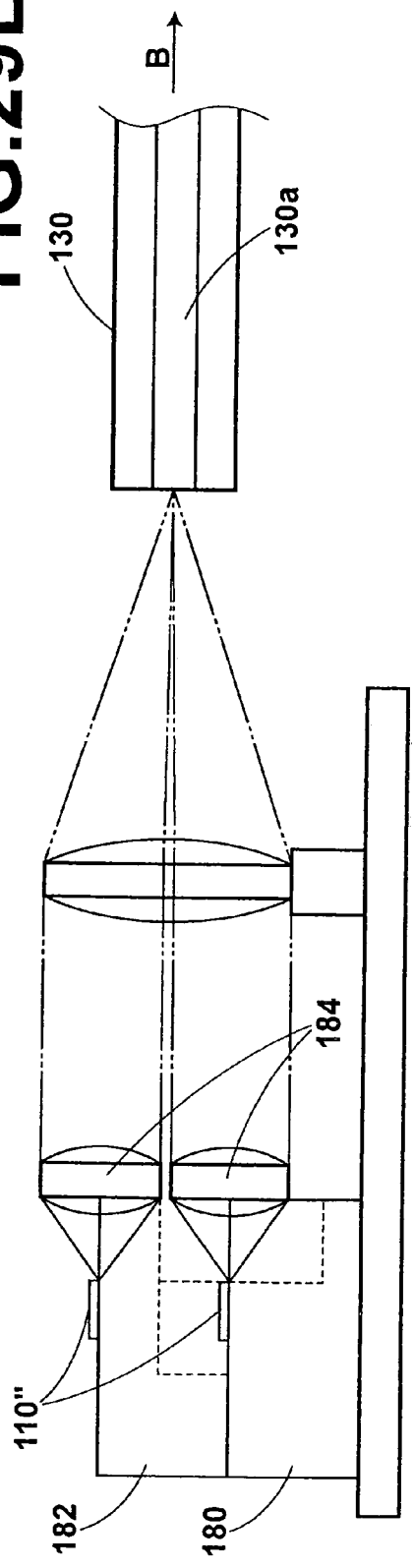

METHOD OF FORMING AN IMAGE

This is a continuation of application Ser. No. 10/671,833 filed Sep. 29, 2003, the disclosure of which is incorporate herein by reference.

BACKGROUND OF THE INVENTION

1. Field of the Invention

The present invention relates to a method of forming an image which modulates light with a spatial light-modulation element, and forms an image on a predetermined surface by using an image-forming optical system, where the image is represented by the light modulated by the spatial light-modulation element.

2. Description of the Related Art

The following documents (1) to (3) disclose information related to the present invention.

(1) Japanese Unexamined Patent Publication No. 2001-305663

(2) Japanese Unexamined Patent Publication No. 2001-21830

(3) Akito Ishikawa, "Reduction of Developing Time by Maskless Exposure and Application to Mass Production," Electronics Packing Technology (Electronics Jissou Gijutsu), Vol. 18, No. 6, (2002) PP. 74–79, Gicho Publishing & Advertising Co., Ltd. (Kabushiki Kaisha Gijutsu Chosa Kai)

In some conventionally known image forming apparatuses, light is modulated by a spatial light-modulation element, and an image represented by the light modulated by the spatial light-modulation element is formed on a predetermined surface by using an image-forming optical system. This type of image forming apparatus is widely used to constitute apparatuses which expose an image by projecting an image formed with modulated light on a photosensitive material, apparatuses which display an image by projecting an image formed with modulated light on a screen, and the like. In addition, the above type of image forming apparatus basically comprises a spatial light-modulation element and an image-forming optical system. In the spatial light-modulation element, a great number of pixel portions are two-dimensionally arranged, and each of the pixel portions modulates light applied to the pixel portion according to a control signal. The image-forming optical system forms an image represented by the light modulated by the spatial light-modulation element.

Document (3) listed above and Japanese Patent Application No. 2002-149886 each disclose an exposure apparatus as an example of an image forming apparatus having the above-mentioned basic construction.

Incidentally, in the above image forming apparatuses, the images projected on the photosensitive material or screen are often required to be magnified. In such cases, a magnified-image-forming optical system is used as the above image-forming optical system. In this case, when the light modulated by the spatial light-modulation element simply passes through the image-forming optical system, the light beams from the respective pixel portions of the spatial light-modulation element are widened, and the pixel size in the projected image becomes great. That is, the sharpness of the image decreases.

In consideration of the above circumstances, for example, Japanese Patent Application No. 2002-149886 discloses another construction. In this construction, a first image-forming optical system is placed so that light modulated by a spatial light-modulation element passes through the first image-forming optical system, and a microlens array is placed in an image-forming plane of the first image-forming optical system. In the microlens array, a plurality of microlenses are arranged in correspondence with pixel portions of the spatial light-modulation element, respectively. In addition, a second image-forming optical system is placed so that the light which has passed through the microlens array passes through the second image-forming optical system, and the second image-forming optical system forms an image represented by the modulated light on a photosensitive material or a screen. The first and second image-forming optical systems are arranged so as to magnify the image projected on the photosensitive material or the screen. In this construction, although the size of the image projected on the photosensitive material or the screen is increased, a plurality of portions of light (light beams) from the pixel portions of the spatial light-modulation element are individually condensed by the respective microlenses constituting the microlens array, and therefore the pixel size (spot size) in the projected image is reduced, i.e., is maintained small. Thus, the sharpness of the image can be maintained high.

Although document (1) discloses the construction in which the spatial light-modulation element and the microlens array are combined, the magnification of the image is not considered in document (1).

In addition, in order to improve the extinction ratio in the construction in which the first and second image-forming optical systems and the microlens array are combined, it has been considered to arrange an aperture array so that apertures of the aperture array are located at positions at which a plurality of portions of light from the microlenses converge, respectively. In this case, it is possible to prevent entrance of stray light into optical paths of the plurality of portions of light modulated by the pixel portions of the spatial light-modulation element, and improve the extinction ratio. Further, document (2) discloses an example of a construction in which a microlens array and an aperture array are combined.

When an attempt is made to achieve a great magnification ratio by using first and second image-forming optical systems as mentioned above in a construction in which the first and second image-forming optical systems and a microlens array are combined as above, some problems can occur depending on magnification powers set in the first and second image-forming optical systems.

That is, when the magnification power in the second image-forming optical system is set to one, and the first image-forming optical system is arranged to have a great magnification power, the lens performance (distortion characteristics) and the extinction ratio deteriorate. This is because when the distortion characteristics of the first image-forming optical system deteriorate, a portion of light modulated by a pixel portion of the spatial light-modulation element may be partially mixed into a microlens corresponding to an adjacent pixel portion of the spatial light-modulation element, and the extinction ratio significantly decreases.

On the other hand, when the magnification power in the first image-forming optical system is set to one, and the second image-forming optical system is arranged to have a great magnification power, it is necessary to limit the beam diameters at the light-condensing positions in the microlenses to a very small amount in consideration of the great magnification power of the second image-forming optical system. Therefore, the entire image-forming optical system is sensitive to errors, and designing such an optical system is not easy.

Further, since, in the construction disclosed in document (2), the focal lengths of the microlenses are about 5 mm, and the numerical apertures (NAs) of the microlenses are small, precise setting of the position of the aperture array in the direction of an optical axis are not considered. However, when a microlens array constituted by microlenses each having a great numerical aperture (NA) and a focal length of about 250 to 300 micrometers is used, it is necessary to precisely set the position of the aperture array in the direction of the optical axis so that apertures of the aperture array are located at positions at which a plurality of portions of light from the microlenses converge, respectively. If the error in the position of the aperture array is great, problems occur. For example, the extinction ratio deteriorates due to entrance of stray light, or increase in the amount of light eclipsed by the circumferences of the apertures reduces the light utilization efficiency.

SUMMARY OF THE INVENTION

The present invention has been developed in view of the above circumstances.

A first object of the present invention is to provide an image forming method utilizing a magnified-image-forming optical system realized by a combination of image-forming optical systems and a microlens array, to prevent deterioration of the extinction ratio caused by distortion aberration in the magnified-image-forming optical system, and to facilitate designing of the magnified-image-forming optical system.

A second object of the present invention is to provide an image forming method in which a microlens array and an aperture array are combined, and being able to precisely set a relative position between the microlens array and the aperture array in the direction of an optical axis.

BRIEF DESCRIPTION OF THE DRAWINGS

FIG. 1 is a perspective view of an image exposure apparatus according to a first embodiment of the present invention.

FIG. 2 is a perspective view of a scanner in the image exposure apparatus of FIG. 1.

FIG. 4 is a schematic perspective view of one of exposure heads in the image exposure apparatus of FIG. 1.

FIG. 5 is an unfolded cross-sectional view of the exposure head of FIG. 4 at an unfolded cross section extending in a subscanning direction.

FIG. 9A is a perspective view of a fiber-array light source.

FIG. 9B is a magnified view of a portion of the fiber-array light source of FIG. 9A.

FIG. 9C is a magnified front view of a first example of the laser-emission end of the fiber-array light source of FIG. 9A, which indicates a first example of an arrangement of light-emission points.

FIG. 9D is a magnified front view of a second example of the laser-emission end of the fiber-array light source of FIG. 9A, which indicates a second example of an arrangement of light-emission points.

FIG. 15A is a schematic, unfolded cross-sectional view of a conventional exposure head at an unfolded cross section containing an optical axis, which is provided for indicating the focal depth of the conventional exposure head.

FIG. 15B is a schematic, unfolded cross-sectional view of an exposure head according to the present invention at an unfolded cross section containing an optical axis, which is provided for indicating the focal depth of the exposure head according to the present invention.

FIG. 21A is a schematic unfolded cross-sectional view of an exposure head at an unfolded cross section perpendicular to a subscanning direction, which is provided for schematically indicating an optical path in the case where a used area of the DMD is appropriate.

FIG. 21B is a schematic unfolded cross-sectional view of the exposure head of FIG. 21A at an unfolded cross section extending in the subscanning direction.

FIG. 28 is a plan view of a third example of the optically-multiplexing laser-light source.

FIG. 29A is a plan view of a fourth example of the optically-multiplexing laser-light source.

FIG. 29B is a cross-sectional view of the optically-multiplexing laser-light source of FIG. 29A at a cross section containing an optical axis.

DESCRIPTION OF PREFERRED EMBODIMENTS

Figure 3A:
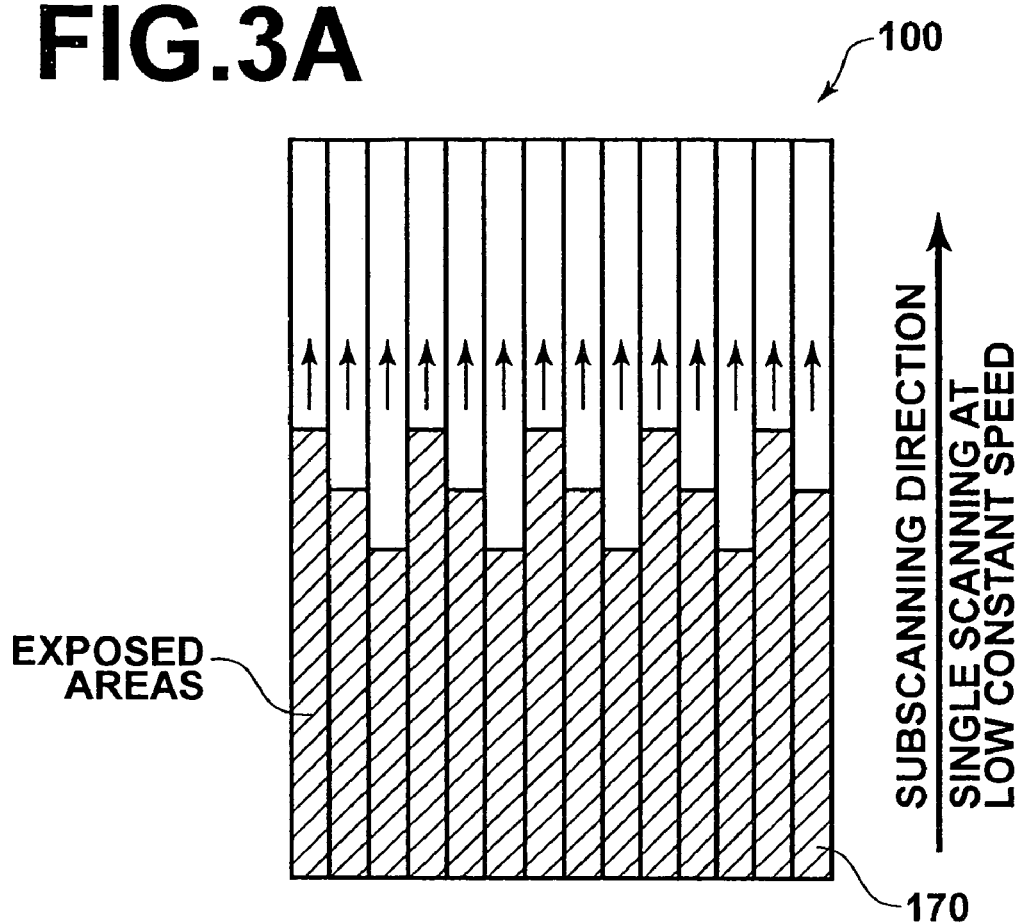
FIG. 3A is a plan view of a photosensitive material, which indicates exposed areas.

Embodiments of the present invention are explained in detail below with reference to the attached drawings.

First, an image exposure apparatus, for use in forming an image, according to the first embodiment of the present invention is explained below.

Construction of First Embodiment

FIG. 1 is a perspective view of the image exposure apparatus according to the first embodiment of the present invention. As illustrated in FIG. 1, the image exposure apparatus according to the first embodiment comprises a planar stage 152 which holds a sheet 150 made of a photosensitive material on its surface by suction. The stage 152 is placed on guides 158 so that the length direction of the stage 152 corresponds to a direction in which the stage 152 moves. The guides 158 are mounted on the upper surface of a mount table 156, which has a shape of a thick plate, and supported by four legs 154. The stage 152 is supported by the two guides 158 so that the stage 152 can move in both directions along the two guides 158. In addition, the image exposure apparatus of FIG. 1 is provided with a driving device (not shown) for moving the stage 152 along the guides 158.

A U-shape gate 160 is arranged at the center of the mount table 156 so that the U-shape gate 160 straddles the path of the stage 152. Two ends of the U-shape gate 160 are respectively fixed to side surfaces of the mount table 156. A scanner 162 is fixed to one side of the U-shape gate 160, and a plurality of sensors 164 (e.g., two sensors) are fixed to the other side of the U-shape gate 160 in order to detect front and rear edges of the photosensitive sheet 150, in such a manner that the scanner 162 and the sensors 164 are fixedly located above the path of the stage 152. In addition, the scanner 162 and the sensors 164 are connected to a controller (not shown) which controls the scanner 162 and the sensors 164.

Figure 3B:
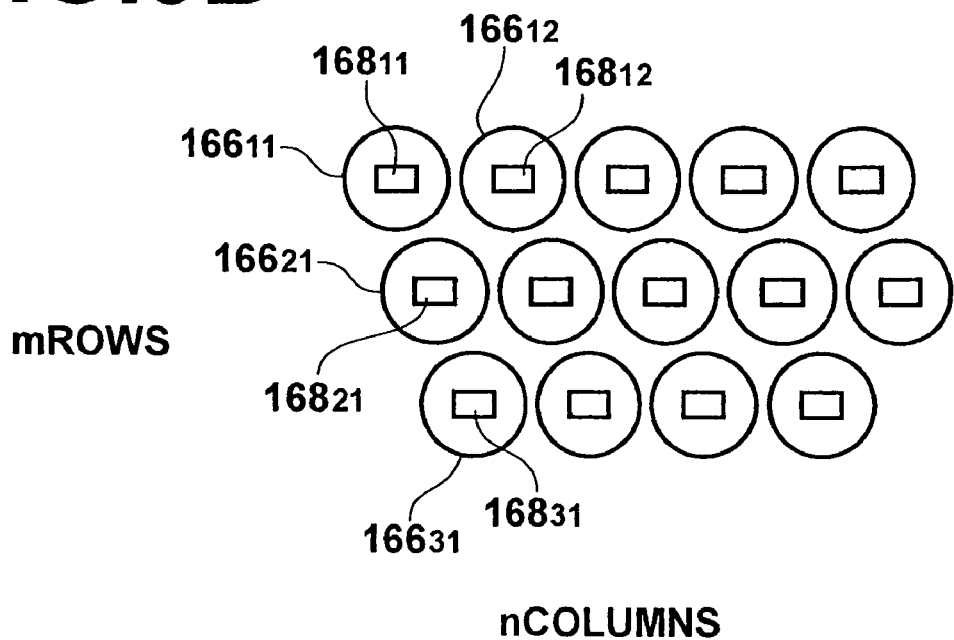
FIG. 3B is a diagram illustrating an arrangement of exposure areas produced by a plurality of exposure heads.

FIG. 2 is a perspective view of the scanner in the image exposure apparatus of FIG. 1, FIG. 3A shows exposed areas formed on the photosensitive material, and FIG. 3B shows an arrangement of exposure areas produced by a plurality of exposure heads. As illustrated in FIGS. 2 and 3B, the scanner 162 comprises a plurality of exposure heads 166 (e.g., fourteen exposure heads) arranged substantially in an m×n matrix (e.g., a matrix with three rows and five columns). In this example, four exposure heads are arranged in the third row based on consideration of the width of the photosensitive sheet 150. Hereinafter, the exposure head located in the mth row and nth column is referred to as the exposure head $166_{mn}$.

An exposure area 168 produced by each of the exposure heads 166 has a rectangular shape, where the shorter side is oriented in the subscanning direction. Therefore, as the stage 152 moves, bandlike exposed areas 170 are formed in correspondence with the exposure heads 166, respectively. The exposure area exposed by the exposure head $166_{mn}$ in the mth row and nth column is referred to as the exposure area $168_{mn}$.

In addition, as illustrated in FIGS. 3A and 3B, in order that the bandlike exposed areas 170 are closely arranged in the direction perpendicular to the subscanning direction, exposure heads linearly arranged in each row are shifted from exposure heads linearly arranged in an adjacent row by a predetermined amount of displacement. For example, the amount of displacement is 1/n of the longer side of each exposure area, where n is a natural number. In this example, n is two. Therefore, for example, areas which are located between the exposure areas $168_{11}$ and $168_{12}$ by the exposure heads $166_{11}$ and $166_{12}$ in the first row, and are not covered by the exposure areas $168_{11}$ and $168_{12}$ can be covered by the exposure areas $168_{21}$ and $168_{31}$ in the second and third rows.

FIG. 4 is a schematic perspective view of one of exposure heads in the image exposure apparatus of FIG. 1, and FIG. 5 is an unfolded cross-sectional view of the exposure head of FIG. 4 at an unfolded cross section extending in the subscanning direction.

As illustrated in FIGS. 4 and 5, each of the exposure heads $166_{11}$ and $166_{mn}$ comprises a digital micromirror device (DMD) 50 as a spatial light-modulation element which modulates an incident light beam according to image data on a pixel-by-pixel basis. The DMD 50 is connected to a controller (not shown) which contains a data-processing unit and a mirror-driving-control unit. The data-processing unit in the controller generates a control signal for controlling driving of each micromirror in an area of the DMD 50 which is to be controlled, for each exposure head. The area to be controlled will be explained later. The mirror-driving-control unit controls the angle of a reflection surface of each micromirror in the DMD 50 in each exposure head based on the control signal generated by the data-processing unit. The control of the angle of the reflection surface will also be explained later.

On the light-entrance side of the DMD 50, a fiber-array light source 66, a condensing lens system 67, and a mirror 69 are arranged in this order. The fiber-array light source 66 has a laser emission portion in which light-emission end portions (light-emission points) of optical fibers are arranged along a line in the direction of the longer side of the exposure area. The condensing lens system 67 shapes laser light emitted from the fiber-array light source 66, and condenses the shaped laser light on the DMD. The mirror 69 reflects toward the DMD 50 the laser light which has passed through the condensing lens system 67. In FIG. 4, the condensing lens system 67 is schematically indicated.

As illustrated in detail in FIG. 5, the condensing lens system 67 comprises a collimator lens 71, a first micro fly-eye lens array 72, a second micro fly-eye lens array 73, and a field lens 74. The collimator lens 71 collimates the laser light emitted from the fiber-array light source 66. The first micro fly-eye lens array 72 is placed in an optical path of light which has passed through the collimator lens 71. The second micro fly-eye lens array 73 is placed so as to face the first micro fly-eye lens array 72. The field lens 74 is placed on the forward side of the second micro fly-eye lens array 73, i.e., on the side toward the mirror 69. Each of the first micro fly-eye lens array 72 and the second micro fly-eye lens array 73 is constituted by a great number of microlens cells which are two-dimensionally arranged. Since a great number of portions of light which have passed through the first micro fly-eye lens array 72 and the second micro fly-eye lens array 73 are superimposed on each other and applied to the DMD 50, the distribution of the quantity of light applied to the DMD 50 becomes uniform.

The light which has passed through the condensing lens system 67 is reflected by the mirror 69, passes through a TIR (total internal reflection) prism 70, and is then applied to the DMD 50.

In addition, an image-forming optical system 51 is arranged on the light-reflection side of the DMD 50. The image-forming optical system 51 forms an image of laser light reflected by the DMD 50, on an exposure surface 56 of the photosensitive sheet 150 to be scanned. As illustrated in FIG. 5, the image-forming optical system 51 comprises a first image-forming optical system constituted by lens systems 52 and 54, a second image-forming optical system constituted by lens systems 57 and 58, and a microlens array 55 and an aperture array 59 which are inserted between the first and second image-forming optical systems. The microlens array 55 is constituted by a great number of microlenses 55a respectively arranged in correspondence with a great number of pixels constituting the DMD 50. In the aperture array 59, a great number of apertures 59a are formed in correspondence with the great number of microlenses 55a of the microlens array 55, respectively.

Figure 6:
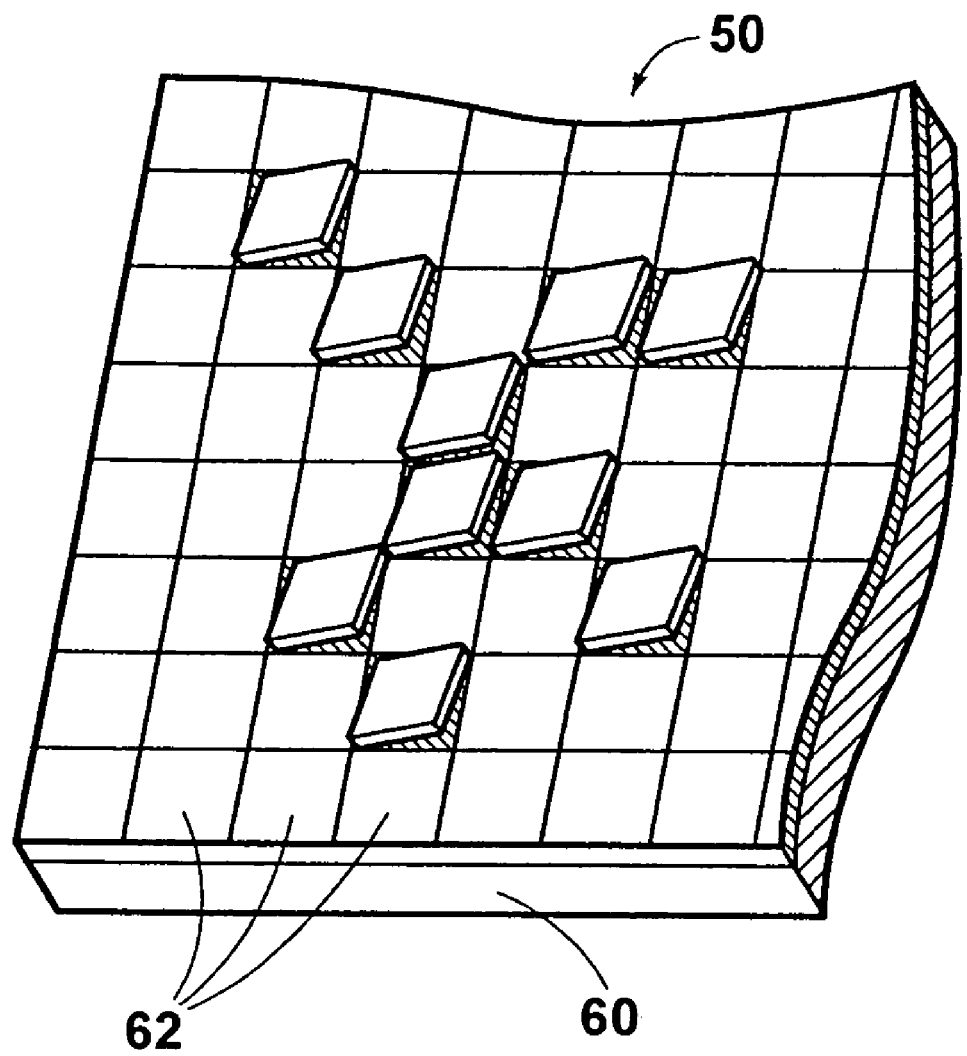
FIG. 6 is a magnified perspective view of a portion of a digital micromirror device (DMD).

FIG. 6 is a magnified perspective view of a portion of the DMD 50. As illustrated in FIG. 6, the DMD 50 is a mirror device constituted by a great number of micromirrors 62 (e.g., 1024×756 micromirrors) being arranged in a matrix and each realizing a pixel. Each micromirror 62 is supported by a micromirror-support post arranged on an SRAM cell (memory cell) 60. That is, a micromirror 62, which is supported by a micromirror-support post, is arranged at the top in each pixel, and the upper surface of the micromirror 62 is coated by evaporation with a highly reflective material such as aluminum. The reflectance of each micromirror 62 is 90% or greater. A silicon-gate CMOS SRAM cell 60 is arranged under each micromirror 62 through a micromirror-support post having a hinge and a yoke, where the silicon-gate CMOS SRAM cell 60 is produced through a conventional manufacturing line of a semiconductor memory, and the entire pixel structure is monolithically (integrally) formed.

Figure 7A:
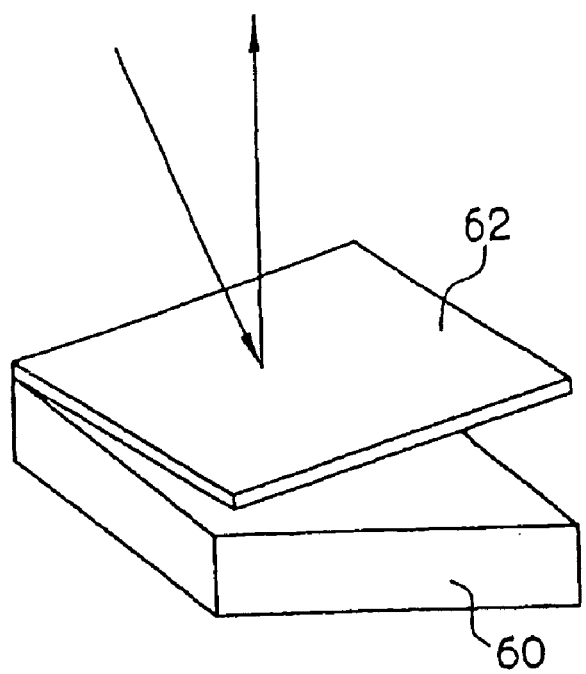
FIGS. 7A and 7B are diagrams for explaining operations of each micromirror constituting the DMD.
Figure 7B:
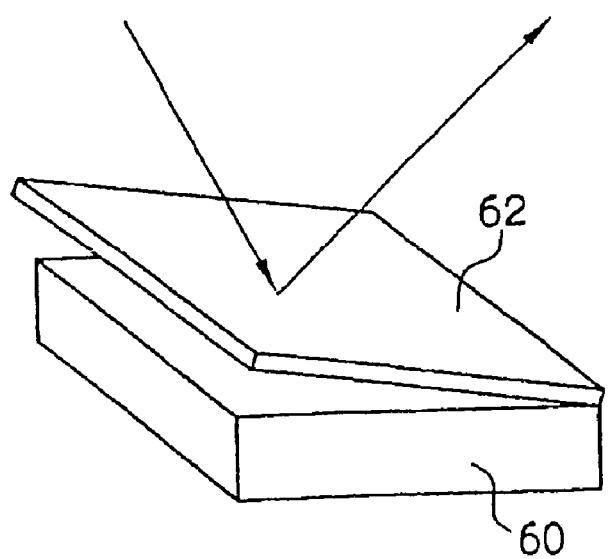

When a digital signal is written in an SRAM cell 60 in the DMD 50, a micromirror supported by a micromirror-support post tilts around a diagonal of the micromirror ±α degrees (e.g., ±10 degrees) with respect to a substrate on which the DMD 50 is formed. FIG. 7A shows the "on" state in which the micromirror tilts +α degrees, and FIG. 7B shows the "off" state in which the micromirror tilts −α degrees. Therefore, when the inclinations of the micromirrors 62 in the respective pixels of the DMD 50 are controlled according to an image signal, for example, as illustrated in FIG. 6, a plurality of portions of light incident on the DMD 50 are reflected to the directions corresponding to the inclinations of the respective micromirrors 62.

FIG. 6 shows a state in which the inclinations of the respective micromirrors 62 are controlled to be +α or −α degrees. The on-off control of the micromirrors 62 is performed by a controller (not shown) which is connected to the DMD 50. In addition, a light absorber (not shown) is placed in the direction to which one or more portions of the light are reflected by one or more portions of the micromirrors which are in the off state.

Figure 8A:
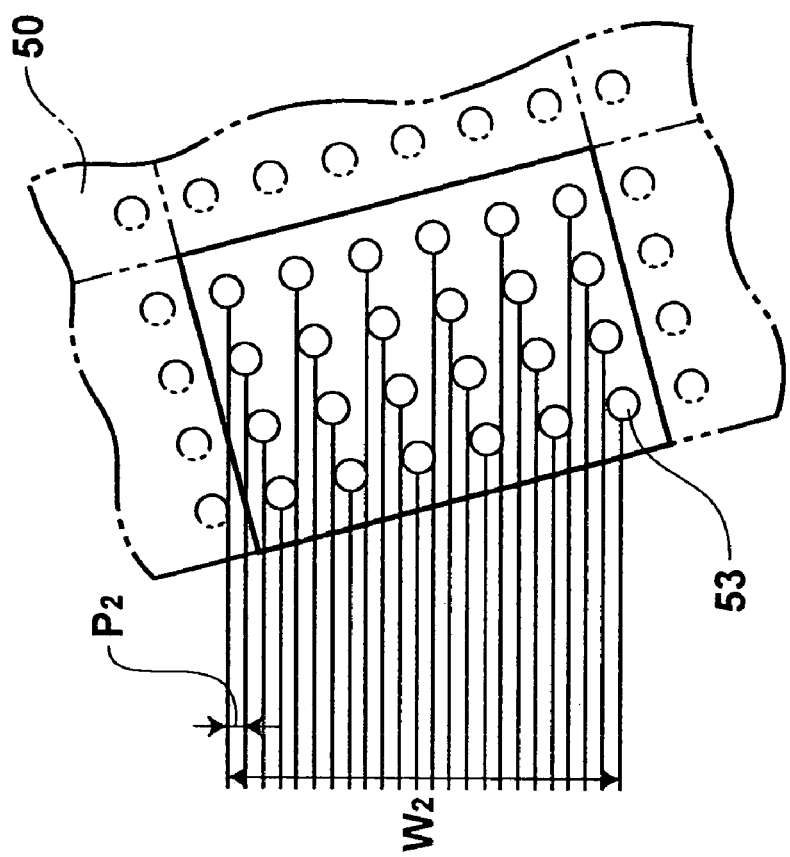
FIG. 8A is a diagram illustrating an arrangement of exposure beams and scanning lines corresponding to the exposure beams in the case where the DMD is not rotated.
Figure 8B:
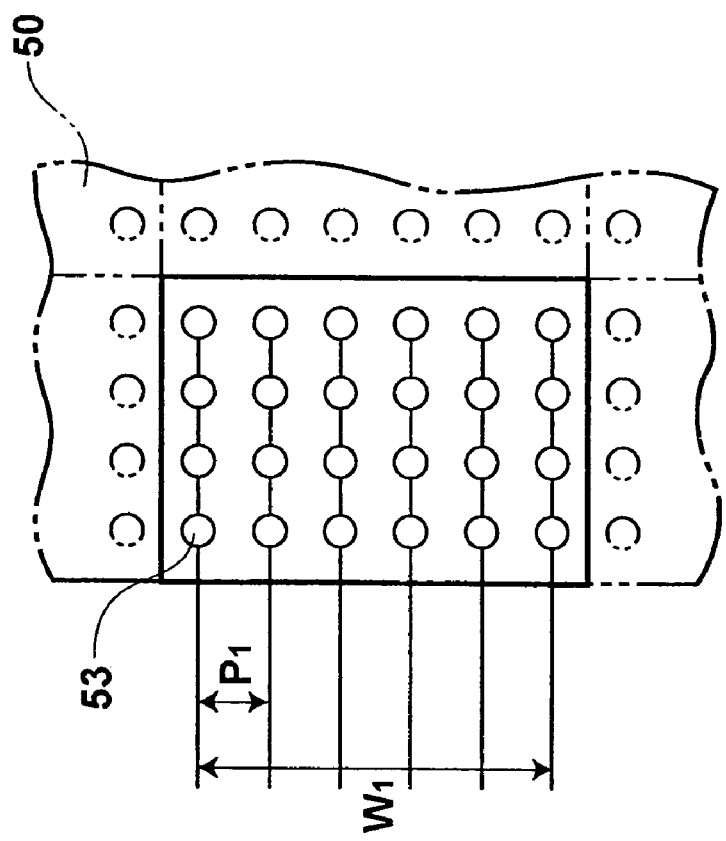
FIG. 8B is a diagram illustrating an arrangement of exposure beams and scanning lines corresponding to the exposure beams in the case where the DMD is rotated.

Further, it is preferable that the DMD 50 is slightly rotated within the plane parallel to the DMD 50 so that the shorter side of the DMD 50 is at a predetermined angle θ (e.g., 1 to 5 degrees) with the subscanning direction. FIG. 8A shows scanning traces of exposure beams (light images) 53 reflected by the respective micromirrors in the case where the DMD 50 is not rotated, and FIG. 8B shows scanning traces of exposure beams 53 reflected by the respective micromirrors in the case where the DMD 50 is rotated.

In the DMD 50, a great number of micromirror arrays (e.g., 756 micromirror arrays) are arranged in the direction of the shorter side, and a great number of micromirrors (e.g., 1,024 micromirrors) are arranged in each micromirror array which extends in the direction of the longer side of the DMD 50. As illustrated in FIG. 8B, the pitch $P_2$ of the scanning lines (scanning traces) of the exposure beams 53 reflected by the respective micromirrors in the case where the DMD 50 is appropriately rotated within the plane parallel to the DMD 50 becomes smaller than the pitch $P_1$ of the scanning lines of the exposure beams 53 reflected by the respective micromirrors in the case where the DMD 50 is not rotated within the plane parallel to the DMD 50. Therefore, the resolution can be greatly increased by the rotation of the DMD 50. In addition, since the rotation angle of the DMD 50 is very small, the scanning width $W_2$ in the case where the DMD 50 is rotated within the plane parallel to the DMD 50 is not substantially changed from the scanning width $W_1$ in the case where the DMD 50 is not rotated within the plane parallel to the DMD 50.

Further, since identical scanning lines are repeatedly exposed with light beams reflected by different micromirrors (i.e., multiple exposure is performed), the exposure positions can be finely controlled, i.e., highly fine exposure can be realized. Furthermore, the fine control of the exposure positions enables smooth filling of the gaps between the plurality of micromirrors arranged in the main scanning direction.

Alternatively, the micromirrors in the DMD 50 may be staggered by displacing each micromirror array by a predetermined amount in a direction perpendicular to the subscanning direction, instead of the rotation of the DMD 50. In this case, similar effects to those obtained by the rotation of the DMD 50 are produced.

FIG. 9A is a perspective view of an example of the fiber-array light source, and FIG. 9B is a magnified view of a light-emission end portion of the fiber-array light source of FIG. 9A.

As illustrated in FIG. 9A, the fiber-array light source 66 comprises a plurality of laser modules (e.g., six laser modules) 64. Each of the laser modules 64 is coupled to an end of a multimode optical fiber 30, and an optical fiber 31 is coupled to the other end of each multimode optical fiber 30. Each multimode optical fiber 30 and each optical fiber 31 have an identical core diameter, and the cladding diameter of each optical fiber 31 is smaller than the cladding diameter of each multimode optical fiber 30.

FIGS. 9C and 9D respectively show first and second examples of the arrangement of light-emission points at the laser-emission end of the fiber-array light source of FIG. 9A. As illustrated in FIG. 9C, a laser-emission portion 68 may be constituted by light-emission end portions (light-emission points) of the optical fibers 31 which are arranged along a line parallel to the main scanning direction, which is perpendicular to the subscanning direction. Alternatively, as illustrated in FIG. 9D, it is possible to arrange the light-emission points in two rows along the main scanning direction.

As illustrated in FIG. 9B, the light-emission end portions of the optical fibers 31 are fixed by being sandwiched by two support plates 65 which have flat surfaces. In addition, in order to protect the end faces of the optical fibers 31, a transparent protection plate 63, which is made of, for example, glass, is arranged on the light-emission side of the optical fibers 31. The protection plates 63 may be arranged in contact with the end faces of the optical fibers 31, or the end faces of the optical fibers 31 may be arranged to be sealed. The end faces of the optical fibers 31 are likely to be contaminated with dust and deteriorate since the light density at the end faces of the optical fibers 31 is high. However, when the protection plate 63 is arranged, it is possible to prevent adhesion of dust to the end faces of the optical fibers 31, and delay deterioration of the end faces of the optical fibers 31.

In this example, the end faces of the optical fibers 31 each having a small diameter are closely arranged along a line. However, the cladding diameters of the multimode optical fibers 30 are greater than the cladding diameters of the optical fiber 31. Therefore, portions of the multimode optical fibers 30 near the optical fibers 31 are bundled in such a manner that each multimode optical fiber in the upper row is arranged in a groove formed between two adjacent multimode optical fibers in the lower row, and an optical fiber 31 coupled to the multimode optical fiber in the upper row is arranged between two optical fibers 31 coupled to the two adjacent multimode optical fibers in the lower row, as illustrated in FIGS. 9A, 9B, and 9C.

Figure 10:
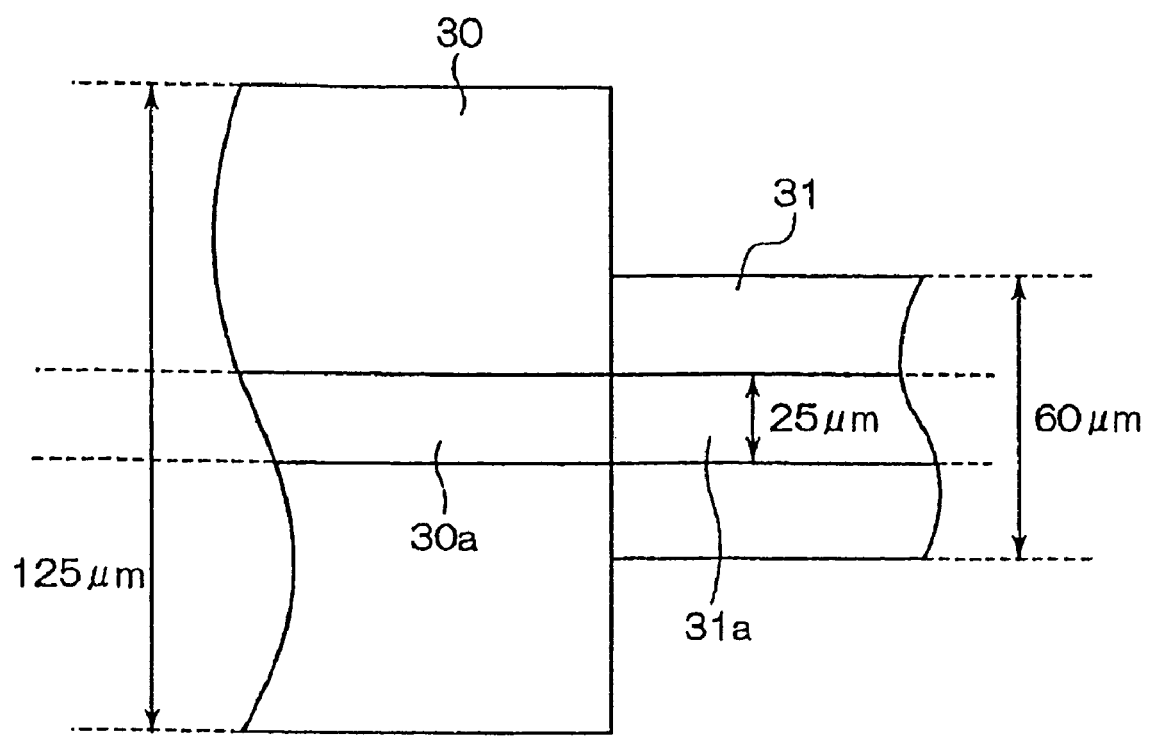
FIG. 10 is a cross-sectional view of an example of coupling of optical fibers.

FIG. 10 is a cross-sectional view of an example of the coupling of each multimode optical fiber 30 and an optical fiber 31. In the example of FIG. 10, an optical fiber 31 having a length of 1 to 30 cm is coaxially coupled to the light-emission end of each multimode optical fiber 30. That is, a light-entrance end face of the optical fiber 31 is coupled to the light-emission end face of the multimode optical fiber 30 by fusion so that the central axis of the multimode optical fiber 30 coincides with the central axis of the optical fiber 31. The diameter of the core 31a of the optical fiber 31 is equal to the diameter of the core 30a of the multimode optical fiber 30.

Alternatively, it is possible to couple a short-length optical fiber to the light-emission end of the multimode optical fiber 30 through a ferrule, an optical connector, or the like. In the case where an optical fiber having a smaller cladding diameter is detachably coupled to each multimode optical fiber 30 by using a connector or the like, the end portion of each optical fiber can be easily replaced when the optical fiber having a smaller cladding diameter is damaged. Therefore, it is possible to reduce the cost of maintenance of the exposure heads. Hereinafter, the optical fibers 31 per se may also be referred to as light-emission end portions.

Each multimode optical fiber 30 and each optical fiber 31 may be a step-index type, a graded-index type, or any combination thereof. For example, the multimode optical fiber 30 and the optical fiber 31 may be formed by using a step-index type optical fiber manufactured by Mitsubishi Cable Industries, Ltd. In this example, the multimode optical fiber 30 and the optical fiber 31 are a step-index type optical fiber. The multimode optical fiber 30 has a cladding diameter of 125 micrometers, a core diameter of 50 micrometers, and a numerical aperture (NA) of 0.2, and the light-entrance end face of the multimode optical fiber 30 is coated with a transmittance of 99.5% or greater. In addition, the optical fiber 31 has a cladding diameter of 60 micrometers, a core diameter of 50 micrometers, and a numerical aperture (NA) of 0.2.

Generally, the transmission loss of infrared laser light increases as the cladding diameter of an optical fiber decreases. Therefore, a preferable cladding diameter is determined for each wavelength range of laser light. However, the transmission loss decreases with decrease in the wavelength. In the case of the laser light having a wavelength of 405 nm, which is emitted from a GaN-based semiconductor laser, the transmission loss hardly increases even when the cladding thickness (i.e., half of the difference of the cladding diameter from the core diameter) is reduced to about one-half the thickness in the case where infrared light in the 800 nm band is transmitted, or about one-fourth the thickness in the case where infrared light in the 1.5 µm band for communication is transmitted. Therefore, it is possible to use a cladding diameter as small as 60 micrometers.

However, the cladding diameter of the optical fiber 31 is not limited to 60 micrometers. Although the cladding diameter of the optical fibers used in the conventional fiber laser-light sources are 125 micrometers, the cladding diameter of the optical fiber 31 is preferably 80 micrometers or smaller, more preferably 60 micrometers, and further preferably 40 micrometers or smaller, since the focal depth increases with decrease in the cladding diameter. On the other hand, since the core diameter is required to be at least 3 to 4 micrometers, it is preferable that the cladding diameter of the optical fiber 31 is 10 micrometers or greater.

Figure 11:
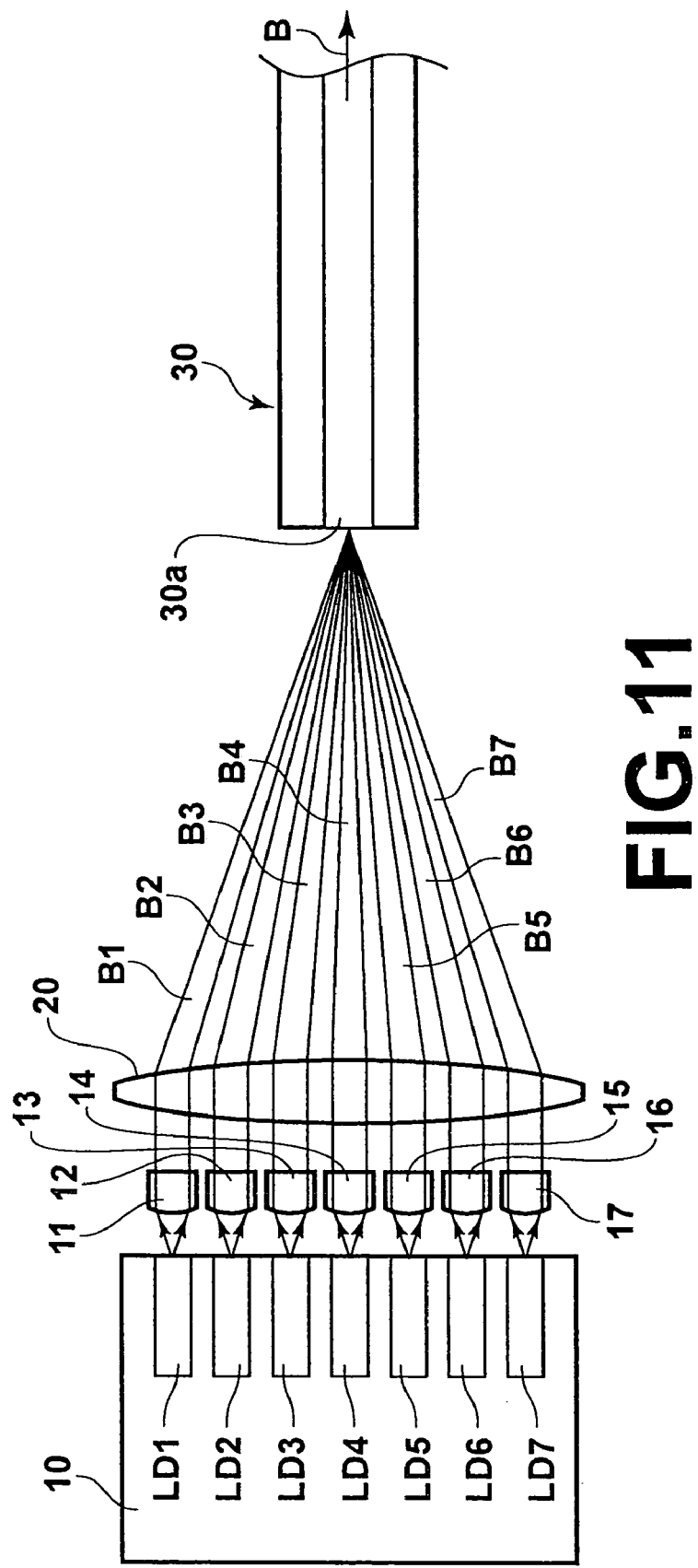
FIG. 11 is a plan view of an optically-multiplexing laser-light source.

FIG. 11 is a plan view of an optically-multiplexing laser-light source used in the image exposure apparatus according to the first embodiment of the present invention. The laser module 64 is constituted by an optically-multiplexing laser-light source (fiber laser-light source) as illustrated in FIG. 11. The optically-multiplexing laser-light source comprises a heat block 10, a plurality of GaN-based semiconductor laser chips (e.g., GaN-based semiconductor laser chips LD1 through LD7) fixedly arranged on the heat block 10, collimator lenses 11 through 17 arranged in correspondence with the GaN-based semiconductor laser chips LD1 through LD7, a condensing lens 20, and a multimode optical fiber 30. Each of the plurality of GaN-based semiconductor laser chips operates in a single or multiple transverse modes.

The number of the GaN-based semiconductor laser chips is not limited to seven. For example, laser beams emitted from as many as twenty semiconductor lasers can enter a multimode optical fiber having a cladding diameter of 60 micrometers, a core diameter of 50 micrometers, and a numerical aperture (NA) of 0.2. Therefore, it is possible to achieve a necessary amount of light in an exposure head, and reduce the number of optical fibers.

The GaN-based semiconductor laser chips LD1 through LD7 have an identical oscillation wavelength and an identical maximum output power. For example, the oscillation wavelength is 405 nm, and the maximum output power is 100 mW in the case of a multimode semiconductor laser, and 30 mW in the case of a single-mode semiconductor laser. Further, the oscillation wavelength of the GaN-based semiconductor laser chips LD1 through LD7 may be any wavelength other than 405 nm in the wavelength range of 350 to 450 nm.

Figure 12:
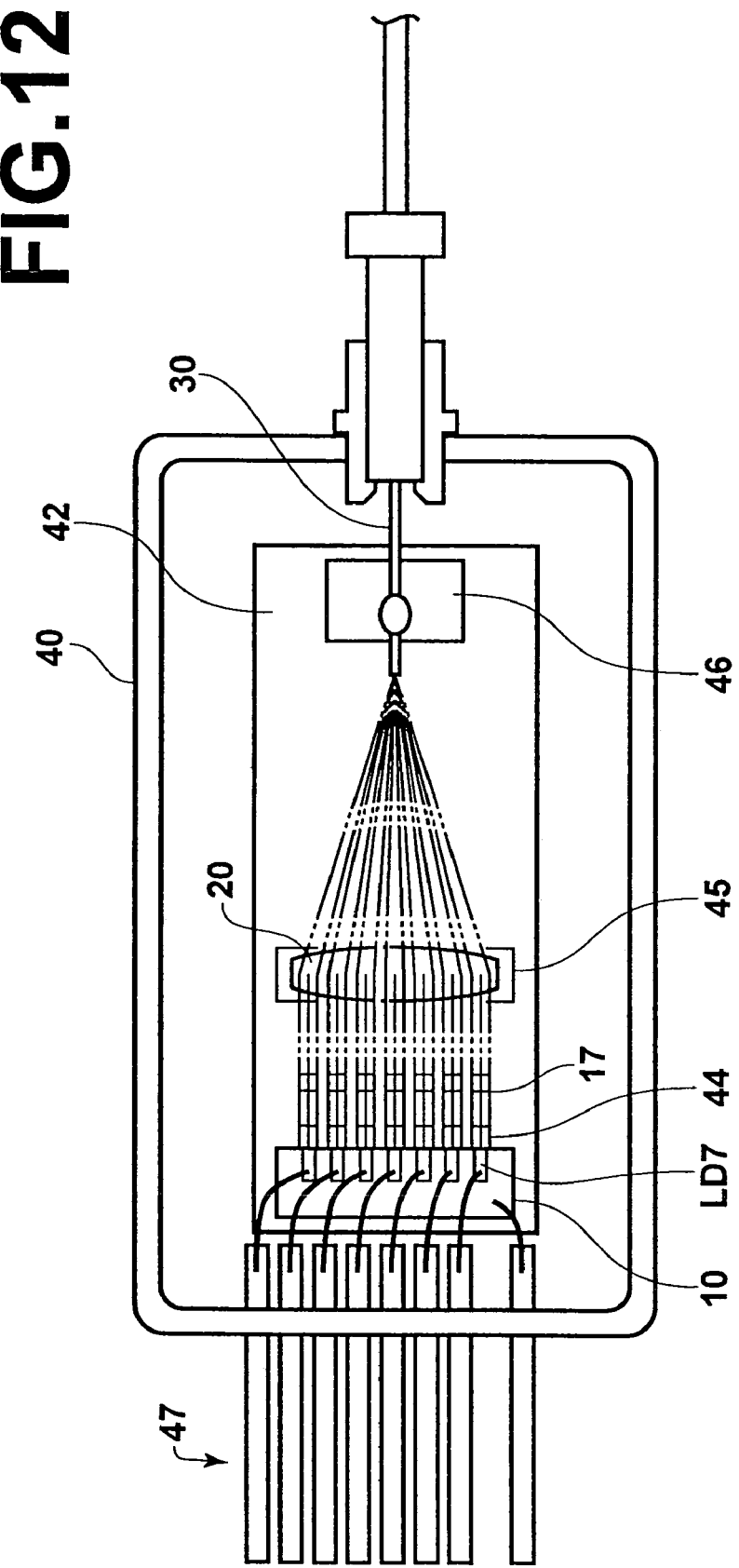
FIG. 12 is a plan view of a laser module.
Figure 13:
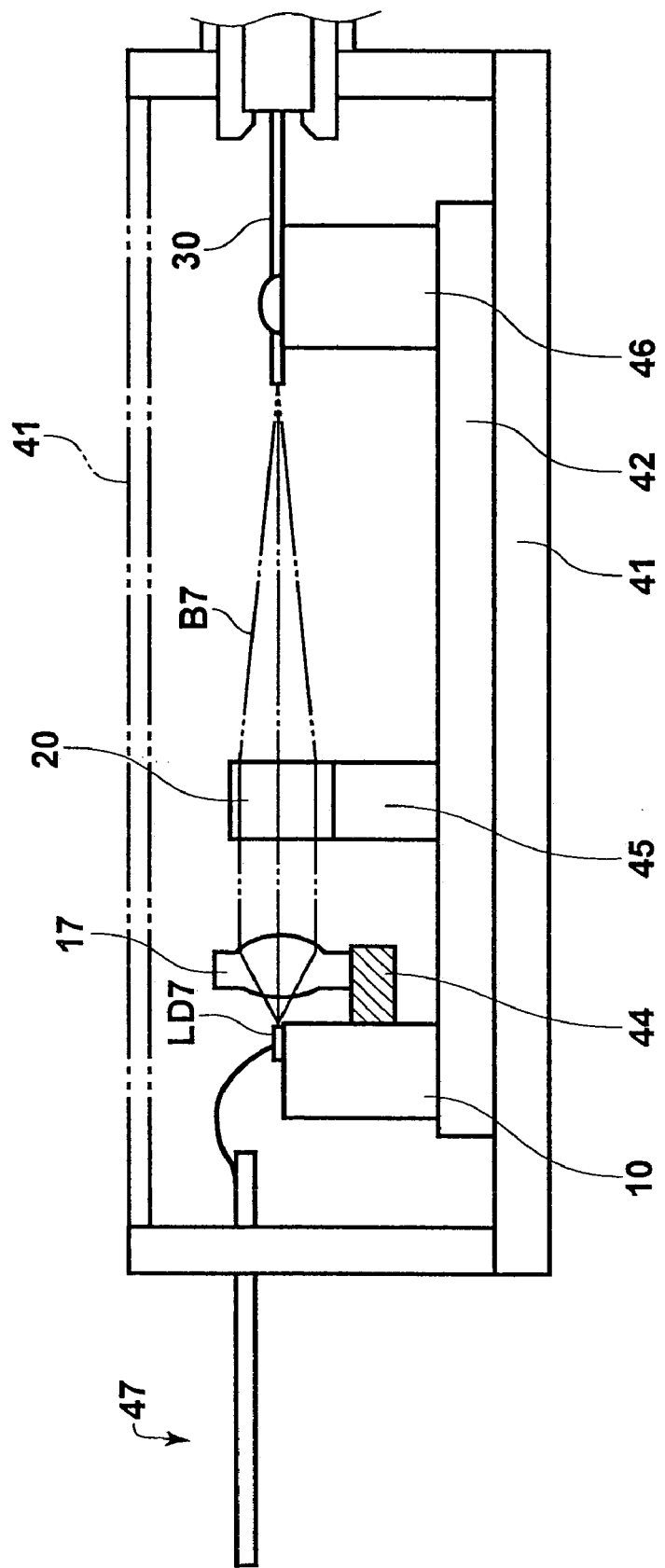
FIG. 13 is a side view of the laser module of FIG. 12.

FIGS. 12 and 13 are plan and side views of the laser module, respectively. In FIG. 13, in order to simplify the illustration, the reference numbers of the GaN-based semiconductor laser chips LD1 to LD6 and the collimator lenses 11 through 16 are not shown.

As illustrated in FIGS. 12 and 13, the above optically-multiplexing laser-light source is contained in a box type package 40 together with other optical elements. The package 40 has an opening on its upper side, and is provided with a cover 41, which is produced so that the opening of the package 40 can be closed with the cover 41. When sealing gas is introduced after deaeration, and the opening is closed with the cover 41, the above optically-multiplexing laser-light source is hermetically sealed in the closed space (sealed space) realized by the package 40 and the cover 41.

A base plate 42 is fixed on the inner bottom surface of the package 40. The aforementioned heat block 10, a condensing-lens holder 45 for holding the condensing lens 20, and a fiber holder 46 for holding the light-entrance end of the multimode optical fiber 30 are fixed to the upper surface of the base plate 42. The light-emission end portion of the optically-multiplexing laser-light source is led out of the package 40 through an opening formed in a wall of the package 40.

In addition, a collimator-lens holder 44 for holding the collimator lenses 11 through 17 is attached to a sidewall of the heat block 10. Further, wirings 47 for supplying driving currents to the GaN-based semiconductor laser chips LD1 through LD7 are led out of the package 40 through openings formed in a sidewall of the package 40.

Figure 14:
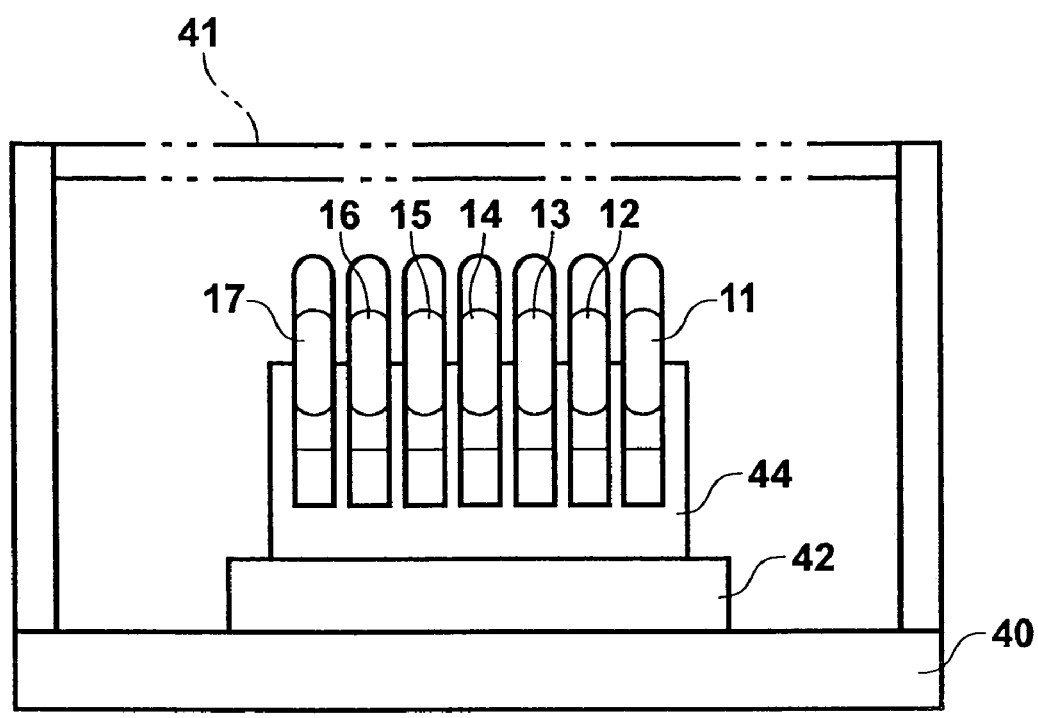
FIG. 14 is a front view of a portion of the laser module of FIG. 12.

FIG. 14 is a front view of a portion of the laser module of FIG. 12 in which the collimator lenses 11 through 17 are attached to the collimator-lens holder 44. Each of the collimator lenses 11 through 17 is formed to have an elongated shape which is obtained by cutting an aspherical round lens with parallel planes so as to leave a portion containing the optical axis of the aspherical round lens. The collimator lenses 11 through 17 can be formed, for example, by molding from resin or optical glass. The collimator lenses 11 through 17 are closely arranged in the direction along which the light-emission points are arranged (i.e., in the horizontal direction in FIG. 14) so that the length directions of the collimator lenses 11 through 17 are perpendicular to the direction along which the light-emission points are aligned.

Each of the GaN-based semiconductor laser chips LD1 to LD7 comprises an active layer having an emission width of about 2 micrometers. For example, the spread angle of each of laser beams B1 through B7 emitted from the GaN-based semiconductor laser chips LD1 to LD7 is 10 degrees in the direction parallel to the active layer and 30 degrees in the direction perpendicular to the active layer. The light-emission points of the GaN-based semiconductor laser chips LD1 to LD7 are arranged along a line parallel to the active layers of the GaN-based semiconductor laser chips LD1 to LD7.

Therefore, the laser beams B1 through B7 emitted from the GaN-based semiconductor laser chips LD1 to LD7 enter the collimator lenses 11 through 17 so that the direction of the greater spread angle of each of the laser beam B1 through B7 coincides with the length direction of each of the collimator lenses 11 through 17, and the direction of the smaller spread angle of each of the laser beam B1 through B7 coincides with the width direction of each of the collimator lenses 11 through 17 (which is perpendicular to the length direction). In this example, each of the collimator lenses 11 through 17 has a width of 1.1 mm and a length of 4.6 mm, and the beam diameter of each of the laser beam B1 through B7 is 0.9 mm in the horizontal direction and 2.6 mm in the vertical direction. In addition, each of the collimator lenses 11 through 17 has a focal length of 3 mm and a numerical aperture (NA) of 0.6, and the collimator lenses 11 through 17 are arranged with a pitch of 1.25 mm.

The condensing lens 20 has a shape which is obtained by cutting an aspherical round lens along two parallel planes so as to leave an elongated portion containing the optical axis of the aspherical round lens. Thus, the condensing lens 20 is elongated in the direction along which the collimator lenses 11 through 17 are arranged, and has a small dimension in the direction perpendicular to the direction along which the collimator lenses 11 through 17 are arranged. The condensing lens 20 has a focal length of 23 mm and a numerical aperture (NA) of 0.2. The condensing lens 20 can also be formed, for example, by molding from resin or optical glass.

Operations of First Embodiment

Operations of the above image exposure apparatus according to the first embodiment are explained below.

In each of the exposure heads 166 in the scanner 162, divergent laser beams B1 through B7 emitted from the GaN-based laser-diode chips LD1 through LD7 in each of the optically-multiplexing laser-light sources 64 (constituting the fiber-array light source 66) are respectively collimated by the corresponding collimator lenses 11 through 17. The collimated laser beams B1 through B7 are collected by the condensing lens 20 so as to converge on the light-entrance end face of the core 30a of the aforementioned multimode optical fiber 30 in the optically-multiplexing laser-light source. In this example, an optical condensing system is constituted by the collimator lenses 11 through 17 and the condensing lens 20, and an optical multiplex system is constituted by the optical condensing system and the multimode optical fiber 30. Thus, the laser beams B1 through B7 collected by the condensing lens 20 as above enter and propagate in the core 30a of the multimode optical fiber 30, in which the laser beams B1 through B7 are optically multiplexed into a single laser beam B. Then, the laser beam B is output from one of the aforementioned optical fibers 31 which is coupled to the light-emission end of the multimode optical fiber 30.

In the case where the coupling efficiency of the laser beam B1 through B7 to the multimode optical fiber 30 is 0.85, and the output power of each of the GaN-based laser-diode chips LD1 through LD7 is 30 mW, an optically-multiplexed laser beam B is obtained with an output power of 180 mW (=30 mW×0.85 ×7) from each of the optical fibers 31. Therefore, in the case where the number of the optical fibers 31 constituting the laser emission portion 68 is six, the output power from the laser emission portion 68 becomes 1 W (=180 mW×6).

As explained above, in the laser emission portion 68 of the fiber-array light source 66, the light-emission points having the high luminance are aligned along a line in the main scanning direction. Since the conventional fiber laser-light source in which laser light from only a single semiconductor laser is coupled to a single optical fiber has low output power, conventionally, a great number of fiber light sources are required to be arranged to obtain a desired output power. However, since the optically-multiplexing laser-light sources used in this embodiment have high output power, a desired output power can be obtained by using a small number of optically-multiplexing laser-light sources. According to the output power of the optically-multiplexing laser-light source, only one optically-multiplexing laser-light source can achieve a desired output power.

For example, in the conventional fiber light sources in which laser light from only a single semiconductor laser is coupled to a single optical fiber, typically, the output power of the semiconductor laser is about 30 mW, the multimode optical fiber has a core diameter of 50 micrometers, a cladding diameter of 125 micrometers, and a numerical aperture (NA) of 0.2. Therefore, in order to obtain an output power of about 1 W by using the conventional fiber light sources, it is necessary to bundle 48 multimode optical fibers. In the case where the cross-sectional area of the emission region is 0.62 mm$^2$ (=0.675 mm×0.925 mm), the luminance at the laser emission portion 68 is 1.6×10$^6$ (W/m$^2$). Therefore, in this case, the luminance per optical fiber is 3.2×10$^6$ (W/m$^2$).

On the other hand, in the present embodiment, as explained before, it is possible to obtain an output power of about 1 W by using six multimode optical fibers. In addition, the cross-sectional area of the emission region in the laser emission portion 68 is 0.0081 mm$^2$ (=0.325 mm×0.025 mm). Therefore, the luminance at the laser emission portion 68 becomes 123×10$^6$ (W/m$^2$), which is about 80 times higher than the corresponding value in the above conventional example. Further, the luminance per optical fiber in the present embodiment is 90×10$^6$ (W/m$^2$), which is about 28 times higher than the corresponding value in the above conventional example.

Next, referring to FIGS. 15A and 15B, the difference in the focal depth between the conventional exposure head and the exposure head in the present embodiment is explained below. FIG. 15A is a schematic, unfolded cross-sectional view of a conventional exposure head, and FIG. 15B is a schematic, unfolded cross-sectional view of an exposure head according to the present invention. Each of FIGS. 15A and 15B is provided for indicating the focal depth of the exposure head. Since the exposure heads in FIGS. 15A and 15B contain DMDs, which are reflection-type spatial light-modulation elements, the optical axes of the exposure heads are not straight, and the exposure heads each contain a plurality of sections in each of which an optical axis is straight. However, in order to clarify the optical relationships, cross sections of the plurality of sections of the exposure heads extended are unfolded in FIGS. 15A and 15B.

While the diameter, in the subscanning direction, of the emission area of the bundle-type fiber light source in the conventional exposure head is 0.675 mm, the diameter, in the subscanning direction, of the emission area of the fiber-array light source in the exposure head in the present embodiment is 0.025 mm. Since the emission area in the laser-light source 1 (the bundle-type fiber light source) in the conventional exposure head is great as illustrated in FIG. 15A, the spread of the incident angles at which the light beams are incident on the DMD 3 is great, and therefore the spread of the incident angles at which the light beams are incident on the scanning surface 5 becomes great. Thus, the beam diameter is likely to be increased by deviation from alignment in the focus direction.

On the other hand, since the diameter, in the subscanning direction, of the emission area of the fiber-array light source 66 in the exposure head in the present embodiment is small as illustrated in FIG. 15B, the spread of the incident angles at which the light beams are incident on the DMD 50 through the lens system 67 is small, and therefore the spread of the incident angles at which the light beams are incident on the scanning surface 56 becomes small. Thus, the focal depth increases. Since the diameter, in the subscanning direction, of the emission area in this example is about one-thirtieth the diameter of the emission area in the conventional exposure head, it is possible to achieve a focal depth almost corresponding to a diffraction limit. Therefore, the exposure head in the present embodiment is suitable for exposure of a very small spot. The above effect on the focal depth becomes more remarkable when the amount of light required to be emitted from the exposure head is greater. In this example, the size of each pixel projected on the scanning surface is 10×10 micrometers.

Image data corresponding to an exposure pattern is input into a controller (not shown) connected to the DMD 50, and is temporarily stored in a frame memory in the controller, where the image data is data which represents the density of each pixel constituting an image by a binary value indicating whether or not a dot is to be recorded.

Referring back to FIGS. 1 and 2, the stage 152 which holds a photosensitive sheet 150 on its surface by suction is moved at a constant speed by the aforementioned driving device (not shown) along the guides 158 from the upstream side to the downstream side of the U-shape gate 160. When the stage 152 passes under the U-shape gate 160, and the front edge of the photosensitive sheet 150 is detected by the sensors 164 fixed to the U-shape gate 160, the image data stored in the frame memory is read out in groups of a plurality of lines, and a control signal for each of the exposure heads 166 is generated by the aforementioned data-processing unit based on the image data which is read out. Then, the aforementioned mirror-driving-control unit performs on-off control of each micromirror 62 in the DMD 50 in each exposure head 166 based on the control signal generated as above.

When laser light from the fiber-array light source 66 is applied to the DMD 50, one or more portions of the laser light reflected by micromirrors of the DMD 50 which are in the on state pass through the image-forming optical system 51, and form an image on the exposure surface 56 of the photosensitive sheet 150. Thus, it is possible to perform on-off control of the laser light emitted from the fiber-array light source 66 for each pixel, and the photosensitive sheet 150 is exposed in units of pixels (constituting the exposure area 168) substantially corresponding to the used pixels in the DMD 50. In addition, since the photosensitive sheet 150 on the stage 152 is moved at a constant speed, the photosensitive sheet 150 can be subscanned with the scanner 162 in the direction opposite to the direction in which the stage 152 moves, so that the aforementioned bandlike exposed areas 170 are formed in correspondence with the exposure heads 166, respectively.

Further, due to use of the image-forming optical system 51, the microlens array 55, and the aperture array 59, which are illustrated in FIG. 5, the present embodiment has the following advantages.

In the construction of FIG. 5, the first image-forming optical system constituted by the lens systems 52 and 54 magnifies an image represented by light reflected to the "on" direction (i.e., light reflected by the micromirrors in the on state in the DMD 50) by three times. The light which has passed through the first image-forming optical system is collected by the aforementioned microlenses 55a in the microlens array 55 in correspondence with the respective pixels of the DMD 50, where the microlenses 55a are arranged at positions at which the first image-forming optical system forms images. Then, the light collected by the respective microlenses 55a passes through the aforementioned apertures 59a of the aperture array 59. The second image-forming optical system constituted by the lens systems 57 and 58 magnifies an image represented by the light which has passed through the apertures 59a, by 1.67 times, and the image magnified by the second image-forming optical system is projected on the exposure surface 56, i.e., the image magnified by the second image-forming optical system is formed on the exposure surface 56. Thus, the image represented by the light reflected to the "on" direction is magnified five (=3×1.67) times in total, and the magnified image is formed and projected on the exposure surface 56.

Figure 16B:
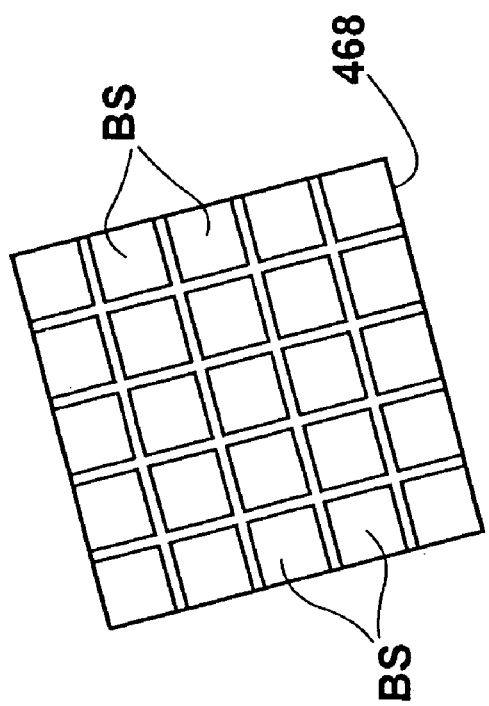
FIG. 16B is a schematic diagram of a light image projected on an exposure surface in a case where a microlens array or the like is used.
Figure 16A:
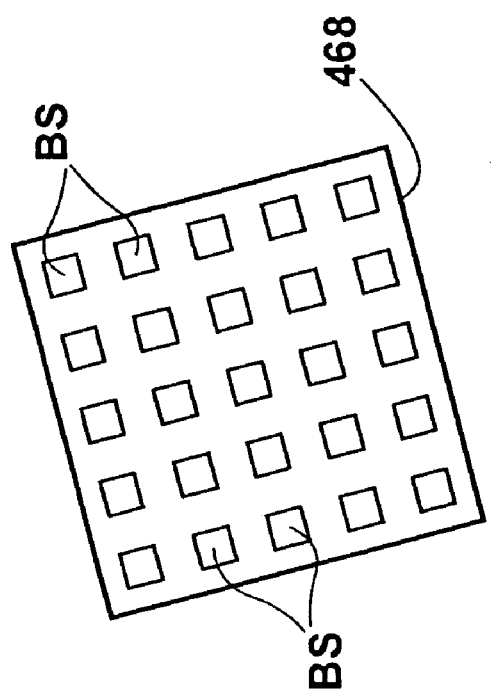
FIG. 16A is a schematic diagram of a light image projected on an exposure surface in a case where a microlens array or the like is not used.

Since the image represented by light reflected by the DMD 50 is magnified five times by the image-forming optical system 51 before the image is projected on the exposure surface 56, the entire image area is enlarged. At this time, if the microlens array 55 and the aperture array 59 are not arranged as explained before, the size (spot size) of each pixel corresponding to a beam spot BS formed by projection on the exposure surface 56 is enlarged in correspondence with the enlargement of the entire exposed area 468 as illustrated in FIG. 16A. Therefore, the MTF (modulation transfer function) characteristics of the exposed area 468 (including the sharpness of the exposed image) deteriorate.

On the other hand, in the exposure head in the present embodiment, in which the microlens array 55 and the aperture array 59 are arranged, one or more portions of light (light beams) which are reflected by the DMD 50 and have passed through the first image-forming optical system are collected by the aforementioned microlenses 55a in the microlens array 55 in correspondence with the pixels of the DMD 50, respectively, where the microlenses 55a are arranged at positions at which the first image-forming optical system forms images. Then, the one or more portions of light collected by the respective microlenses 55a pass through the aforementioned apertures 59a of the aperture array 59. Therefore, even when the exposed area is enlarged, it is possible to limit the size of each beam spot BS to a desired size (e.g., 10×10 micrometers) as illustrated in FIG. 16B. Thus, it is possible to prevent deterioration of the MTF (modulation transfer function) characteristics, and realize highly fine exposure. In FIGS. 16A and 16B, the exposed area 468 is rotated for the reason which is explained with reference to FIG. 8B.

In addition, even when the light beams are thickened due to aberration of the microlens array 55, it is possible to shape the light beams by the apertures 59a so that the spot sizes on the exposure surface 56 are maintained constant. Further, since light beams corresponding to the respective pixels pass through different apertures 59a, it is possible to prevent crosstalk between adjacent pixels.

Next, the image-forming optical system 51 is explained in detail with reference to FIG. 5. In the image-forming optical system 51, the focal lengths f1 and f2 of the lens systems 52 and 54 constituting the first image-forming optical system and the focal lengths f3 and f4 of the lens systems 57 and 58 constituting the second image-forming optical system satisfy the relationships, f2=3f1, and f4=1.67f3, as mentioned before.

In addition, since the pitch of the micromirrors in the DMD 50 is 13.7 micrometers, and the magnification power of the first image-forming optical system is three, each image generated by the DMD 50 is formed with a pixel pitch of 41.4 micrometers at the image-forming position of the first image-forming optical system. Since the magnification power, three, of the first image-forming optical system is relatively small, the distortion aberration of the first image-forming optical system is relatively small. Therefore, the errors in the pixel pitch of each image generated by the DMD 50 can be limited to 0.5 micrometers or smaller.

Further, the lens arrangement pitch of the microlenses 55a in the microlens array 55 is 41.4 micrometers in correspondence with the above pixel pitch of the image formed by the first image-forming optical system, and the microlenses 55a are arranged at the image-forming positions of the first image-forming optical system. In this example, the focal length of the microlenses 55a is 188 micrometers, and a plurality of portions of light which has passed through the first image-forming optical system are condensed so as to have a beam diameter of 2.3 micrometers. In the case where the lens arrangement pitch is 41.4 micrometers as mentioned before, even when errors in the positions at which a plurality of portions of light having passed through the first image-forming optical system enter the microlenses 55a are only one micrometer, the extinction ratio deteriorates to approximately 1:40.

Therefore, when the distortion aberration of the first image-forming optical system is great, and the pitch precision of the image is low, the extinction ratio deteriorates. In addition, when aberration occurs in the light beams from the image-forming optical system, the extinction ratio deteriorates as well as the image generated by the DMD 50 is blurred. In the present embodiment, since the magnification power of the first image-forming optical system is set to a relatively small value, three, as mentioned before, it is possible to suppress the distortion aberration of the first image-forming optical system, and prevent occurrence of the above problems.

On the other hand, since the magnification power of the second image-forming optical system constituted by the lens systems 57 and 58 is also set to a relatively small value, 1.67, even when the beam diameters at the convergence positions of the microlenses 55a become a relatively large value, 2.3 micrometers, it is possible to reduce the beam diameters on the exposure surface 56 to a sufficiently small value, about 4 micrometers, make the beam pitch 68.6 micrometers, and expose a highly fine image. That is, when beam diameters at the convergence positions of the microlenses 55a are allowed to be relatively great, tolerance in arrangement of the image-forming optical system increases, and designing of the image-forming optical system becomes easy.

For example, in order to limit the beam diameters on the exposure surface 56 to about 4 micrometers in the case where the magnification power of five is achieved by only the second image-forming optical system, it is necessary to limit the beam diameters at the convergence positions of the microlenses 55a to a very small value of 0.8 micrometers. In such an image-forming optical system, tolerance in arrangement of the image-forming optical system is small, and designing of the image-forming optical system becomes difficult.

Figure 17:
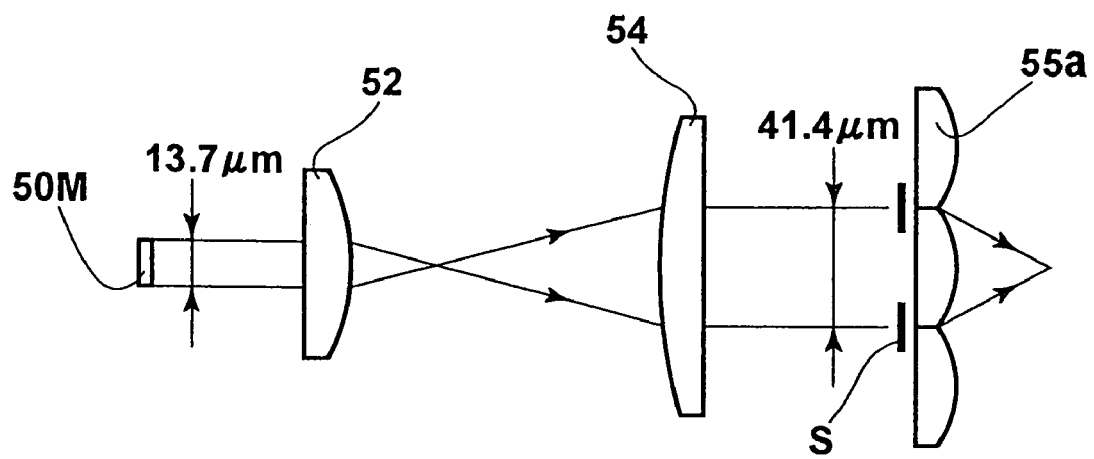
FIG. 17 is a schematic side view of a portion of the optical system used in the image exposure apparatus of FIG. 1.

When the numerical aperture (NA) of the first image-forming optical system is greater, it is more effective to set the magnification power of the first image-forming optical system to a relatively small value. This characteristic is explained below with reference to FIGS. 17 and 18. FIG. 17 schematically shows an optical system containing the first image-forming optical system constituted by the lens systems 52 and 54 and a portion of the microlenses 55a constituting the microlens array 55. In FIG. 17, one of the micromirrors constituting the DMD 50 is indicated by reference 50M.

Figure 18:
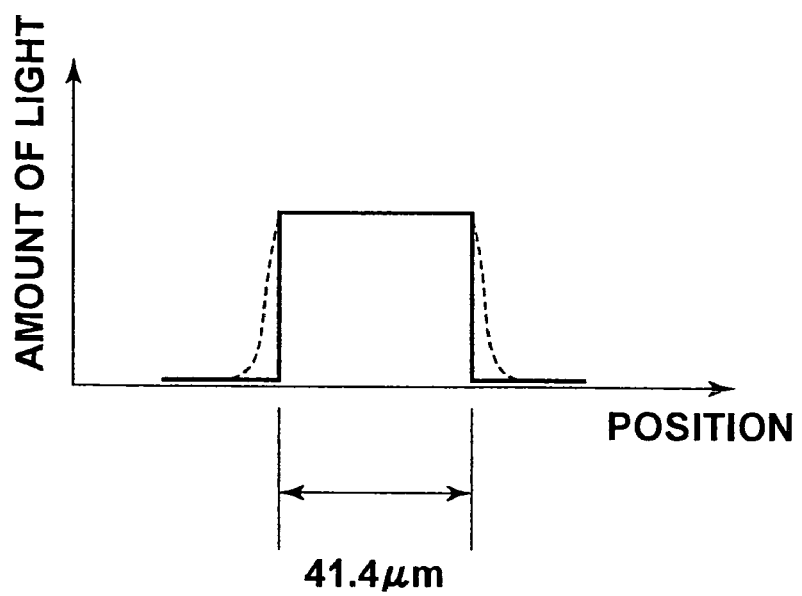
FIG. 18 is a graph indicating a distribution of the quantity of light in a light beam which enters one of microlenses constituting the microlens array through the optical system of FIG. 17.

FIG. 18 is a graph indicating a distribution of the quantity of light in a light beam entering one of the microlenses 55a through the optical system of FIG. 17. When the spread of the light beam is limited as indicated by the solid lines in FIG. 18, only a light beam from a micromirror corresponding to a microlens enters the microlens, and light beams from other micromirrors (e.g., micromirrors adjacent to the above micromirror corresponding to the microlens) do not enter the microlens. Therefore, the extinction ratio is satisfactory. When the numerical aperture (NA) of the first image-forming optical system is great, the satisfactory extinction ratio can be obtained. If the numerical aperture (NA) of the first image-forming optical system is small, the light beam entering one of the microlenses 55a spreads as indicated by the dashed lines in FIG. 18. Therefore, measures such as arrangement of a shield member S for shielding each of the microlenses 55a from light beams from micromirrors other than a micromirror corresponding to the shielded microlens are necessary.

In consideration of the above, it is preferable that the first image-forming optical system has a great numerical aperture (NA). However, it is difficult to realize small aberration in an image-forming optical system having a great numerical aperture, in comparison with the case where the numerical aperture is small. However, when the magnification power is divided between the first and second image-forming optical systems so that the magnification power of the first image-forming optical system is relatively small, and the distortion aberration of the first image-forming optical system is small, it is possible to adopt as the first image-forming optical system an optical system having a great numerical aperture. In addition, the division of the magnification power between the first and second image-forming optical systems is advantageous for achievement of a satisfactory extinction ratio.

Generally, when the numerical aperture (NA) of the first image-forming optical system is 0.2, the Airy disc diameter at each of the microlenses 55a is 3 micrometers. Therefore, it is not desirable to increase the Airy disc diameter by making the numerical aperture smaller than 0.2. In other words, in order to realize small aberration in constructions according to the present invention, it is particularly preferable that the numerical aperture (NA) of the first image-forming optical system is 0.2 or greater.

Figure 19:
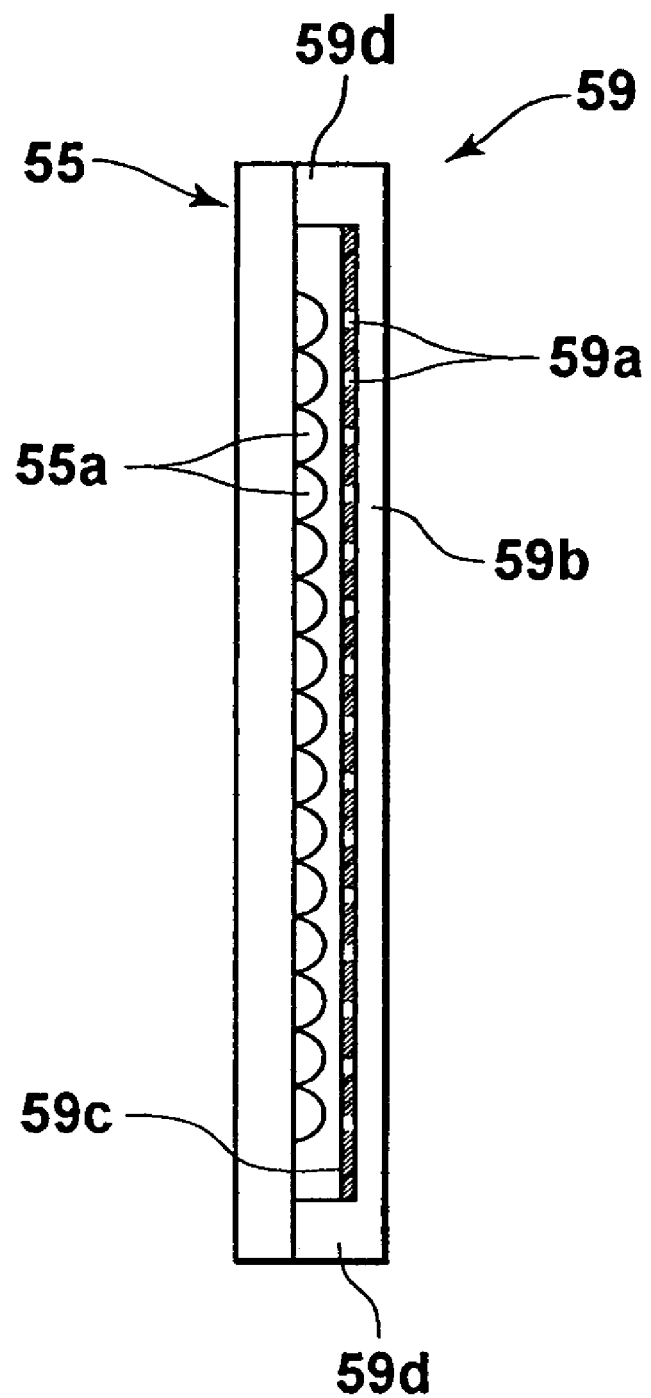
FIG. 19 is a schematic side view of an assembly of a microlens array and an aperture array used in the image exposure apparatus of FIG. 1.

Next, the microlens array 55 and the aperture array 59 are explained in detail with reference to FIG. 19, which is a schematic side view of an assembly of a microlens array and an aperture array used in the image exposure apparatus of FIG. 1. For example, the microlens array 55 is made of crystal glass in accordance with a first predetermined pattern so as to contain a great number of microlenses 55a arranged in a matrix.

On the other hand, the aperture array 59 is made by forming a mask 59c on a substrate portion 59b made of crystal glass by, for example, evaporation of chromium, where the mask 59c has a plurality of openings realizing the apertures 59a, and the plurality of openings are arranged in accordance with a second predetermined pattern which corresponds to the above first predetermined pattern.

In addition, a protrusion 59d having a predetermined height H is formed along the circumference of the aperture array 59 toward the microlens array 55 (i.e., in the direction of the lens axes). The aperture array 59 is fixed to the microlens array 55, for example, with an adhesive so that the protrusion 59d is in contact with a surface of the microlens array 55.

When the aperture array 59 in the above construction is manufactured so that the protrusion 59d has an appropriate height as designed, it is possible to precisely set the relative position between the microlens array 55 and the aperture array 59 in the direction of the optical axes so that the apertures 59a are located at positions at which light beams which have passed through the microlenses 55a converge. Therefore, it is possible to prevent deterioration of the extinction ratio, and enhance the light utilization efficiency.

It is preferable that the top surface of the protrusion 59d and the surface of the microlens array 55 which is in contact with the top surface of the protrusion 59d are highly flat surfaces having a flatness of 0.2 micrometers or smaller. In the case where the top surface of the protrusion 59d and the surface of the microlens array 55 which is in contact with the top surface of the protrusion 59d are bumpy, the microlens array 55 and the aperture array 59 are likely to move relative to each other in a direction perpendicular to the optical axes when the surfaces of the microlens array 55 and the aperture array 59 are pressed against each other for fixation. However, in the case where the top surface of the protrusion 59d and the surface of the microlens array 55 which is in contact with the top surface of the protrusion 59d each have a flatness of 0.2 micrometers or smaller, it is possible to prevent the above relative movement between the microlens array 55 and the aperture array 59 in directions perpendicular to the optical axes even when the surfaces are pressed against each other for fixation, and precisely set the relative position between the microlens array 55 and the aperture array 59 in a plane perpendicular to the optical axes. Thus, the high flatness of the surfaces of the microlens array 55 and the aperture array 59 in contact with each other contributes to improvement in the extinction ratio and the light utilization efficiency.

In the present embodiment, the microlens array 55 and the aperture array 59 are made of an identical material, i.e., the linear expansion coefficients of the microlens array 55 and the aperture array 59 are identical. Therefore, even when the microlens array 55 and the aperture array 59 expand or contract according to changes in the ambient temperature, it is possible to prevent misalignment between the microlenses 55a and the apertures 59a.

Alternatively, in order to set the relative position between the microlens array 55 and the aperture array 59 in the direction of the optical axes, it is possible to form a protrusion toward the aperture array 59 on the microlens array 55, instead of forming the protrusion 59d on the aperture array 59. Further, it is also possible to form protrusions on both of the microlens array 55 and the aperture array 59.

Figure 20A:
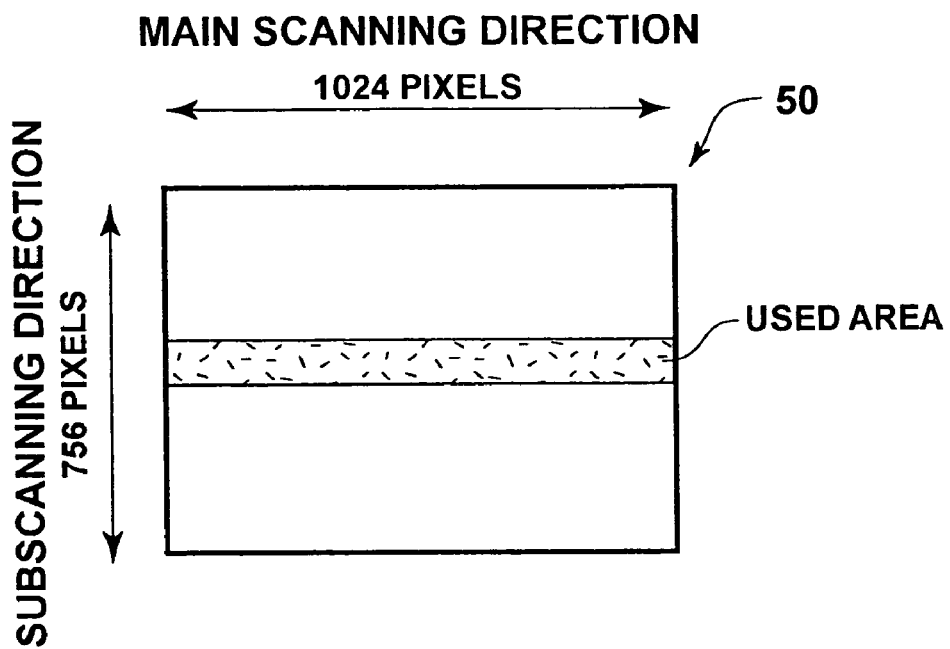
FIGS. 20A and 20B are diagrams indicating examples of used areas of the DMD.
Figure 20B:
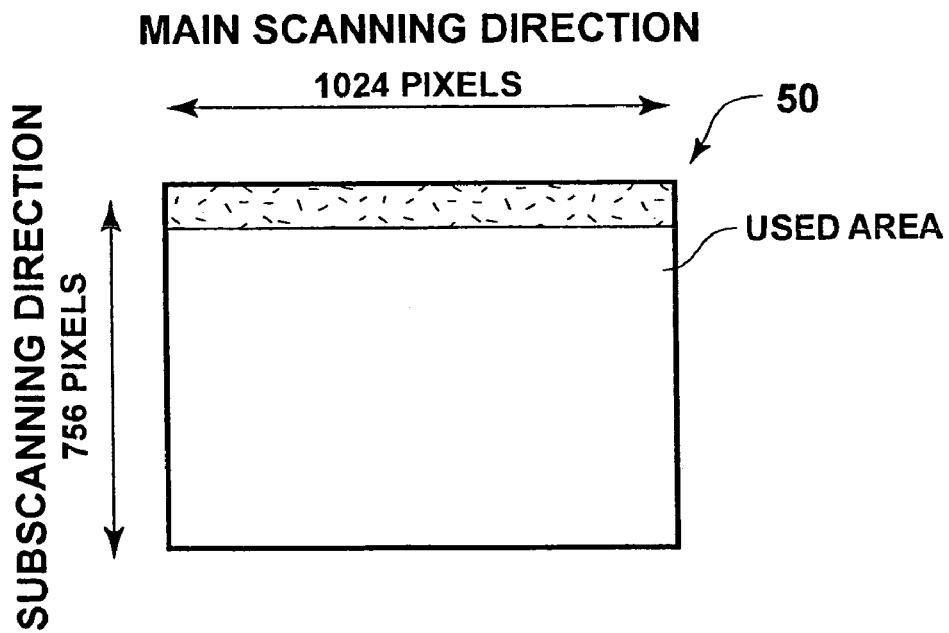

FIGS. 20A and 20B are diagrams indicating examples of used areas of the DMD. In the DMD 50 used in the present embodiment, 756 micromirror arrays are arranged in the subscanning direction, and each micromirror array is constituted by 1,024 micromirrors aligned in the main scanning direction. However, the aforementioned controller controls the DMD 50 in such a manner that only a portion of the micromirror arrays (e.g., 300 micromirror arrays) are driven as illustrated in FIGS. 20A and 20B. In this case, the driven portion may be located at the center of the DMD 50 as illustrated in FIG. 20A, or at an end of the DMD 50 as illustrated in FIG. 20B. Further, it is possible to change the driven portion according to the circumstances. For example, when a defect is detected in a micromirror, it is possible to use a portion of the DMD 50 which does not contain the defective micromirror.

The data processing speed of the DMD 50 has an upper limit. Since the modulation rate per line is determined by (i.e., proportional to) the number of used pixels, the modulation rate per line increases when only a portion of the micromirror arrays are used. In addition, in exposure systems in which an exposure head is continuously moved relative to an exposure surface, it is unnecessary to use all pixels of the DMD arranged in the subscanning direction.

For example, in the case where only 300 of 600 micromirror arrays are used, the modulation rate per line is doubled in comparison with the case where all of the 600 micromirror arrays are used. In addition, in the case where only 200 of 600 micromirror arrays are used, the modulation rate per line is tripled in comparison with the case where all of the 600 micromirror arrays are used. In the latter case, an area having a length of 500 mm in the subscanning direction can be exposed in 17 seconds. Further, in the case where only 100 of 600 micromirror arrays are used, the modulation rate per line is sextupled in comparison with the case where all of the 600 micromirror arrays are used. In this case, an area having a length of 500 mm in the subscanning direction can be exposed in 9 seconds.

The number of used micromirror arrays, i.e., the number of used micromirrors arranged in the subscanning direction, is preferably 10 to 200, and more preferably 10 to 100. In this example, the area per micromirror corresponding to a pixel is 15×15 micrometers. Therefore, when the above preferable numbers of used micromirror arrays are converted into the used areas of the DMD 50, the used areas of the DMD 50 is preferably 12 mm×150 µm to 12 mm×3 mm, and more preferably 12 mm×150 µm to 12 mm×1.5 mm.

FIGS. 21A and 21B schematically show an optical path in an exposure head in the case where the used area of the DMD is appropriate. FIGS. 21A and 21B are unfolded cross-sectional views of the exposure head at an unfolded cross section perpendicular to the subscanning direction and an unfolded cross section extending in the subscanning direction, respectively. For the same reason indicated before for FIGS. 15A and 15B, cross sections of the plurality of sections of the exposure head are unfolded in FIGS. 21A and 21B. When the number of used micromirror arrays is within the above range of the preferable values, the laser light emitted from the fiber-array light source 66 is mostly collimated by the condensing lens system 67, and is then applied to an area of the DMD 50, as illustrated in FIGS. 21A and 21B. At this time, it is preferable that the area of the DMD 50 irradiated with the collimated laser light coincides with the aforementioned used area of the DMD 50. When the irradiated area of the DMD 50 is greater than the used area of the DMD 50, the utilization efficiency of the laser light decreases.

In addition, it is necessary to reduce the diameters, in the subscanning direction, of the light beams converged on the DMD 50 according to the number of micromirrors arranged in the subscanning direction by using the condensing lens system 67. However, when the number of used micromirror arrays is less than ten, the spread of the incident angles of the light beams incident on the DMD 50 becomes great, and the focal depths of the light beams at the exposure surface 56 become unpreferably small. Further, from the viewpoint of the modulation rate, it is preferable that the number of used micromirror arrays does not exceed 200.

When an operation of subscanning the photosensitive sheet 150 by the scanner 162 is completed, and the sensors 164 detects the rear edge of the photosensitive sheet 150, the driving device (not shown) moves the stage 152 back to its initial position along the guides 158, where the initial position is the most upstream position of the guides 158. Then, the driving device moves the stage 152 again from upstream to downstream along the guides 158 at the constant speed.

As explained above, in the image exposure apparatus according to the first embodiment, the controller controls the DMD so that only a portion of the micromirror arrays are driven, where 756 micromirror arrays each constituted by 1,024 micromirrors are arranged in the DMD along the subscanning direction. In this case, the modulation rate per line becomes greater than the modulation rate per line in the case where all of the micromirror arrays are driven. Thus, high-speed exposure is enabled.

In addition, since a high-luminance fiber-array light source in which light-emission ends of a plurality of optically-multiplexing laser-light sources are arranged in an array is used as a light source for illuminating the DMD, it is possible to realize an image exposure apparatus having high output power and a great focal depth. Further, since each fiber light source constituting the fiber-array light source has high output power, the number of fiber light sources required for achieving a desired output power is small, and therefore the image exposure apparatus becomes inexpensive.

In this embodiment, the cladding diameter at the light-emission end of each optical fiber is smaller than the cladding diameter of the light-entrance end of the optical fiber, the diameter of the light-emission portion becomes small, and the luminance of the fiber-array light source can be increased. Therefore, it is possible to realize an image exposure apparatus having a great focal depth. For example, even in exposure with a beam diameter of 1 micrometer or smaller and an extremely high resolution of 0.1 micrometers, a great focal depth can be achieved. Thus, high-speed, highly-fine exposure is enabled. In particular, the image exposure apparatus according to the first embodiment is suitable for use in the process of exposure of a thin-film transistor (TFT), in which a high resolution is required.

Second Embodiment

Figure 22:
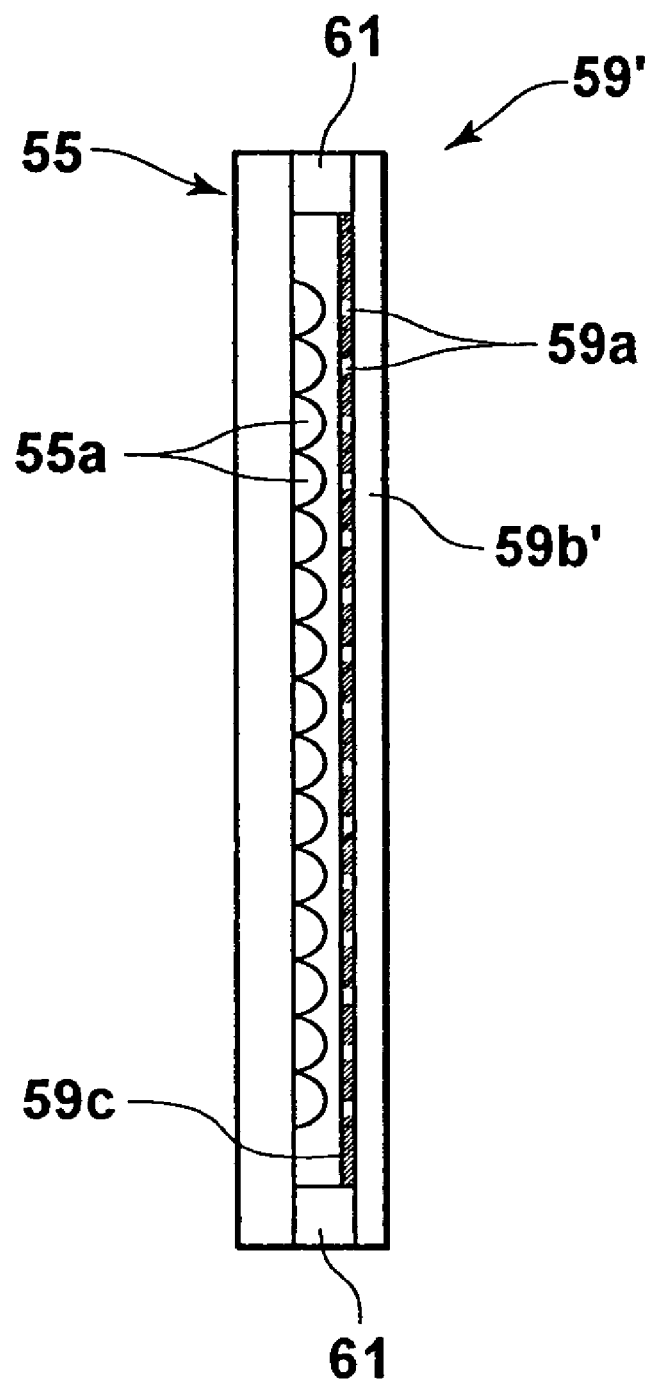
FIG. 22 is a schematic side view of an assembly of a microlens array and an aperture array in a second embodiment of the present invention.

The second embodiment of the present invention is explained below with reference to FIG. 22, which is a schematic side view of an assembly of a microlens array and an aperture array in the second embodiment of the present invention. In FIG. 22, elements which are equivalent to corresponding elements in FIG. 19 are denoted by the same reference numerals as the corresponding elements in FIG. 19, and the explanations on the equivalent elements are not repeated here.

In the construction of FIG. 22, a substrate portion 59$b'$ of an aperture array 59' has a simple planar shape. The other portions of the aperture array 59' are identical to the corresponding portions of the aperture array 59 in FIG. 19. The aperture array 59' and a microlens array 55 are combined through a spacer 61 having a predetermined thickness H'.

When the spacer 61 in the above construction is manufactured so as to have an appropriate thickness as designed, it is possible to precisely set the relative position between the microlens array 55 and the aperture array 59' in the direction of the optical axes so that the apertures 59$a$ are located at positions at which light beams which have passed through the microlenses 55$a$ converge. Therefore, it is possible to prevent deterioration the extinction ratio, and enhance the light utilization efficiency.

It is preferable that the contact surfaces of the spacer 61 and the surfaces of the microlens array 55 and the aperture array 59' in contact with the contact surfaces of the spacer 61 are highly flat surfaces each having a flatness of 0.2 micrometers or smaller. In the case where the contact surfaces of the spacer 61 and the surfaces of the microlens array 55 and the aperture array 59' in contact with the contact surfaces of the spacer 61 are bumpy, the microlens array 55 and the aperture array 59' are likely to move relative to each other in a direction perpendicular to the optical axes when the surfaces of the microlens array 55 and the aperture array 59' are pressed against each other through the spacer 61 for fixation. However, in the case where the contact surfaces of the spacer 61 and the surfaces of the microlens array 55 and the aperture array 59' in contact with the contact surfaces of the spacer 61 each have a flatness of 0.2 micrometers or smaller, it is possible to prevent the above relative movement between the microlens array 55 and the aperture array 59' in directions perpendicular to the optical axes when the surfaces are pressed against each other for fixation, and precisely set the relative position between the microlens array 55 and the aperture array 59' in the plane perpendicular to the optical axes. Thus, the high flatness of the contact surfaces of the spacer 61 and the surfaces of the microlens array 55 and the aperture array 59' in contact with the contact surfaces of the spacer 61 contributes to improvement in the extinction ratio and the light utilization efficiency.

Other Spatial Light-Modulation Elements

In the first embodiment, the micromirrors in the DMD are partially driven. Alternatively, it is possible to use an elongated DMD in which a great number of micromirrors are two-dimensionally arranged on an elongated substrate, where the angle of a reflection plane of each of the micromirrors can be changed according to a control signal, and a first length of the substrate in a first predetermined direction is greater than a second length of the substrate in a second predetermined direction different from the first predetermined direction. In this case, the number of micromirrors which are controlled for changing the angles of their reflection planes is also small. Therefore, as in the case where the micromirrors in the DMD are partially driven, it is possible to increase the modulation rate.

In the above examples, the exposure heads comprises a DMD as a spatial light-modulation element. However, the present invention can also be applied to image forming apparatuses in which exposure heads comprise other types of spatial light-modulation elements. For example, the spatial light-modulation elements may be: MEMS (micro electromechanical systems) type SLMs (spatial light modulators); optical elements which modulate transmitted light by the electro-optical effect, e.g., PLZT (lanthanum-doped lead zirconate titanate) elements; or liquid crystal shutters, e.g., FLC (ferroelectric liquid crystal) shutters; where microsystems in which micro-size, sensors, actuators, and control circuits are integrated by using the micromachining technology based on the IC manufacturing processes are collectively called MEMS, and the MEMS type SLMs are spatial light-modulation elements which are driven by electromechanical operations utilizing electostatic forces.

Other Exposure Methods

Figure 23:
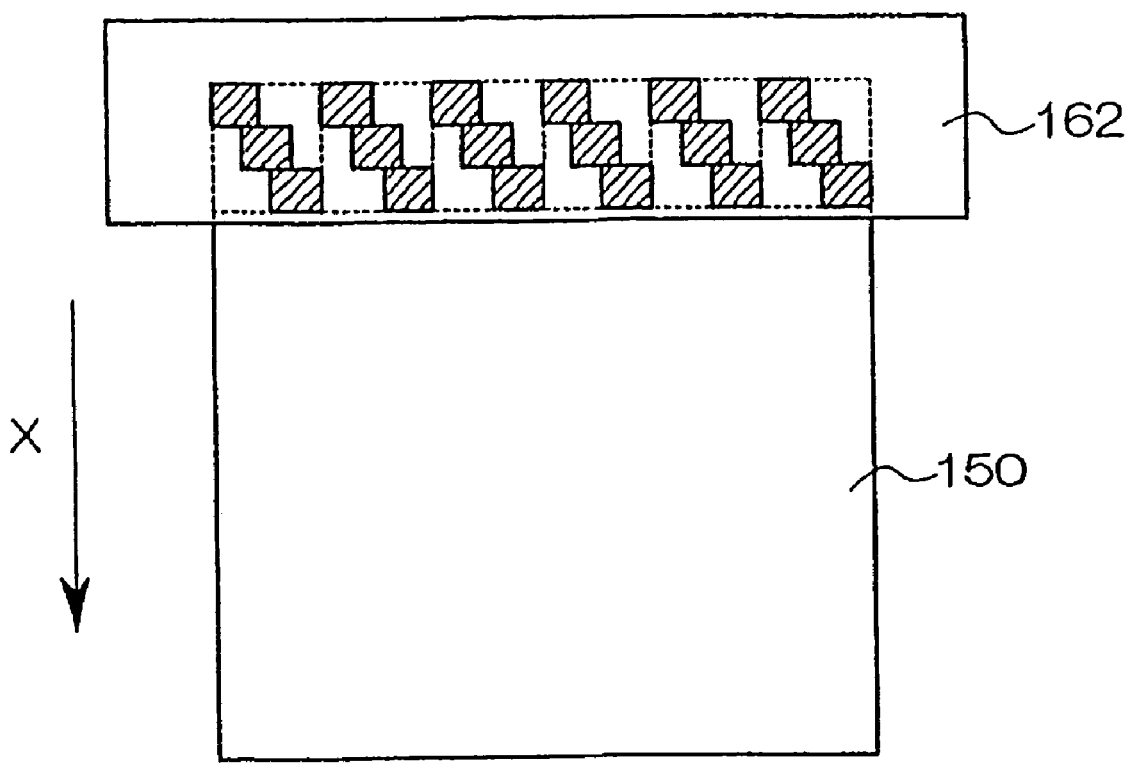
FIG. 23 is a plan view of a photosensitive material, which is provided for explaining an exposure method for exposing the photosensitive material with a scanner in a single scanning cycle.

In the above examples, the entire area of the photosensitive sheet 150 is scanned in the X-direction with the scanner 162 in a single scanning cycle, as illustrated in FIG. 23.

Figure 24A:
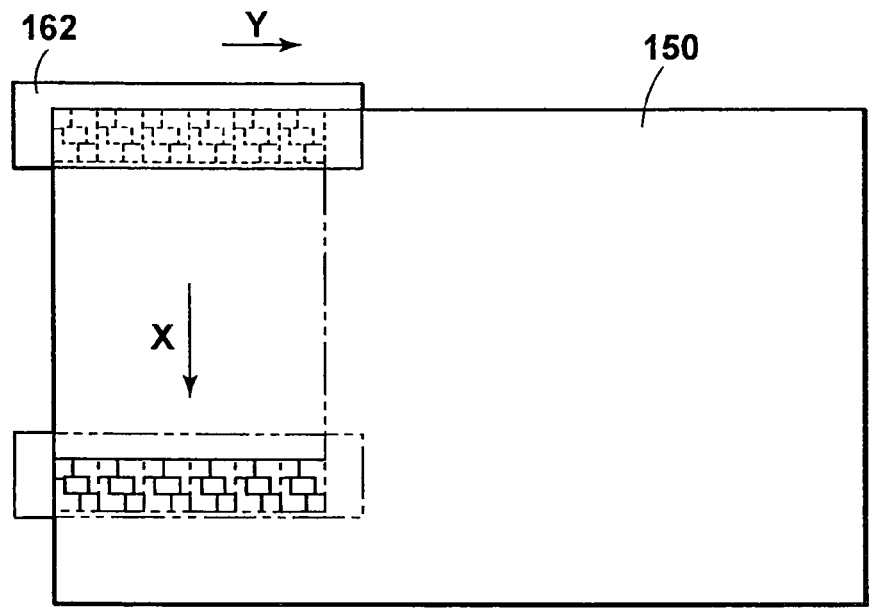
FIGS. 24A and 24B are plan views of a photosensitive material, which are provided for explaining an exposure method for exposing the photosensitive material with a scanner in a plurality of scanning cycles.
Figure 24B:
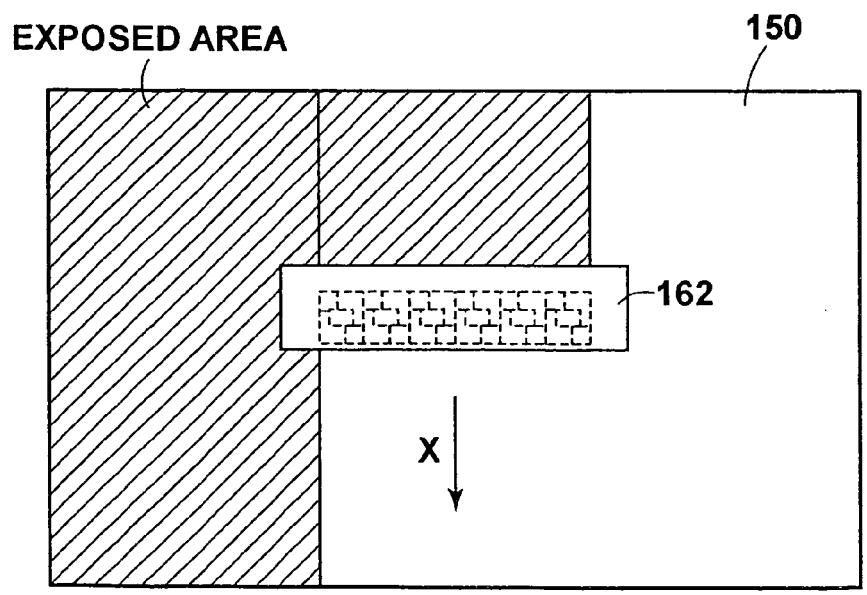

Alternatively, it is possible to scan the entire photosensitive sheet 150 in a plurality of scanning cycles, as illustrated in FIGS. 24A and 24B. In the exposure method illustrated in FIGS. 24A and 24B, after a portion of the photosensitive sheet 150 is scanned in the X-direction with the scanner 162 in a scanning cycle, the scanner 162 is moved in the Y direction by one step, and the adjacent portion of the photosensitive sheet 150 is scanned in the X-direction with the scanner 162 in the next scanning cycle. Then, similar operations are repeated until scanning of the entire photosensitive sheet 150 is completed. In the examples of FIGS. 23, 24A, and 24B, the scanner 162 comprises eighteen exposure heads 166.

Other Laser Apparatuses (Light Sources)

In the above examples, a fiber-array light source in which a plurality of optically-multiplexing laser-light sources are arranged is used. Alternatively, it is possible to use other laser apparatuses. For example, it is possible to use a fiber-array light source in which a plurality of fiber light sources are arranged, and each of the plurality of fiber light sources comprises a single semiconductor laser having a single light-emission point and being coupled to a single optical fiber.

Figure 25:
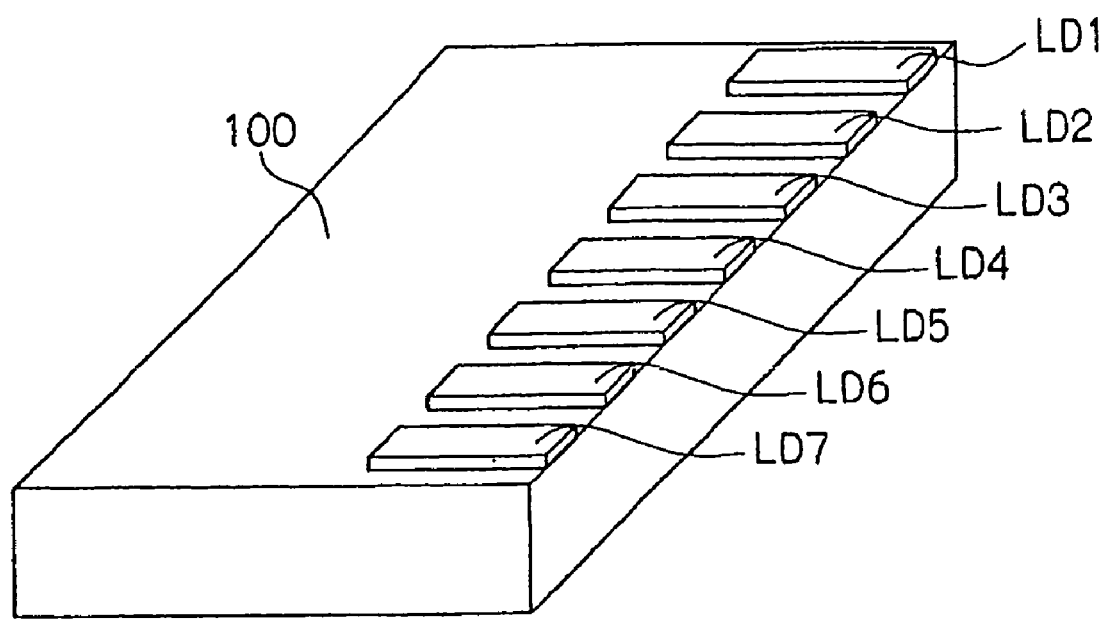
FIG. 25 is a perspective view of a laser array.
Figure 26A:
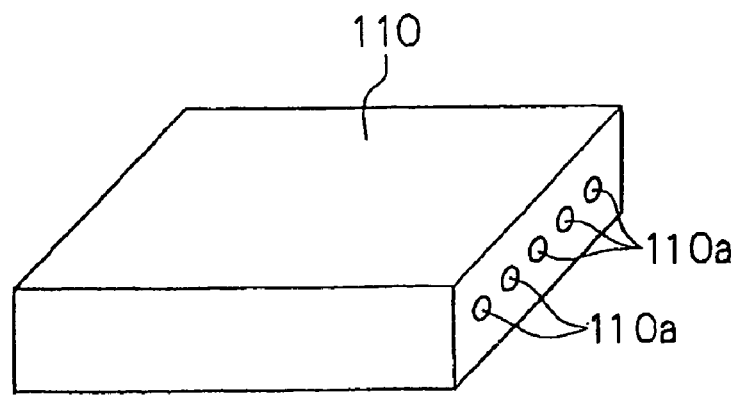
FIG. 26A is a perspective view of a multicavity semiconductor laser.

Further, it is also possible to use a light source having a plurality of light-emission points. For example, such a light source can be realized by a laser array in which a plurality (e.g., seven) of semiconductor laser chips LD1 through LD7 are arranged on a heat block 100, as illustrated in FIG. 25. Alternatively, it is possible to use a known multicavity laser chip 110 having a plurality (e.g., five) of light-emission points 110a which are aligned along a predetermined direction as illustrated in FIG. 26A. In the case where the multicavity laser chip 110 is used, the light-emission points can be aligned more precisely, and therefore it is easier to optically multiplex laser beams emitted from the light-emission points, in comparison with the case where a plurality of semiconductor laser chips are arranged. However, when the multicavity laser chip 110 has too many light-emission points, distortion of the multicavity laser chip 110 is likely to occur during manufacture of the multicavity laser chip 110. Therefore, it is preferable that the number of the light-emission points 110a in the multicavity laser chip 100 does not exceed five.

Figure 26B:
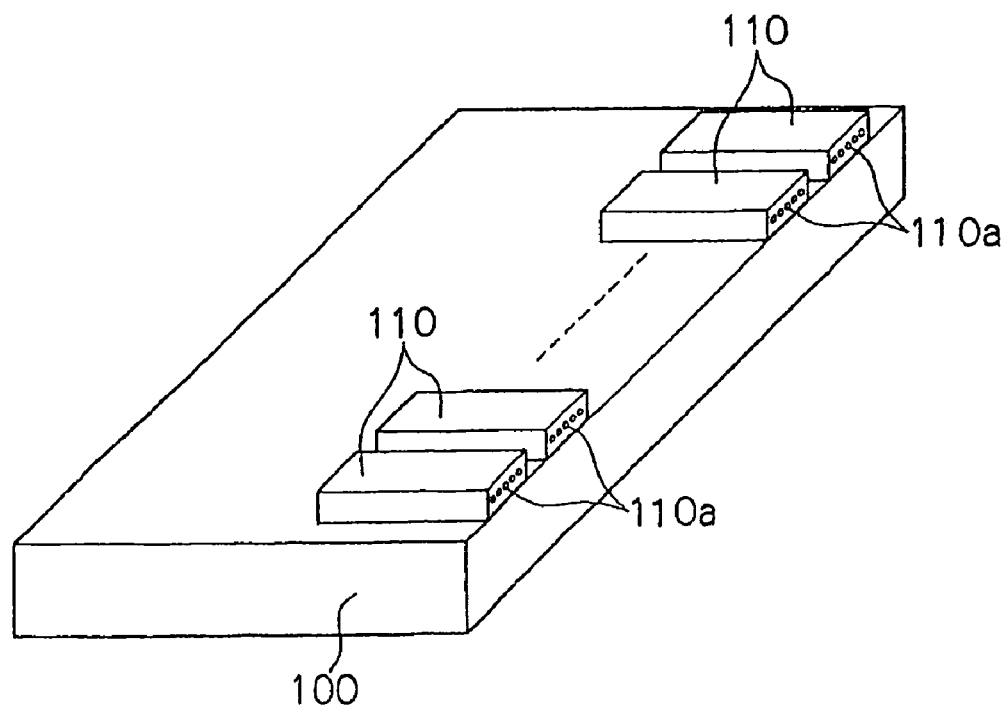
FIG. 26B is a perspective view of a multicavity-laser array in which a plurality of multicavity semiconductor lasers each having the construction of FIG. 26A are arranged.

Furthermore, it is possible to use as a laser apparatus (light source) a multicavity-laser array in which a plurality of multicavity laser chips 110 are arranged on a heat block 100 along the direction along which the light-emission points 110a in each multicavity laser chip 110 are aligned, as illustrated in FIG. 26B.

Figure 27:
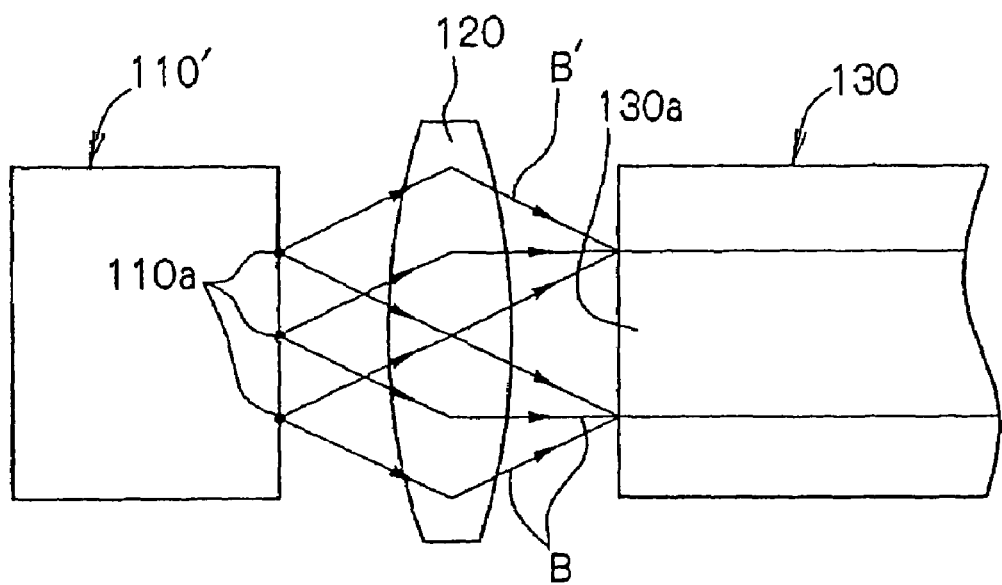
FIG. 27 is a plan view of a portion of a second example of the optically-multiplexing laser-light source.

Since the optically-multiplexing laser-light source is not limited to the construction in which laser beams emitted from a plurality of semiconductor laser chips are optically multiplexed, for example, it is possible to use an optically-multiplexing laser-light source which comprises a multicavity laser chip 110' having a plurality (e.g., three) of light-emission points 110a, a condensing lens 120, and a multimode optical fiber 130, as illustrated in FIG. 27. For example, the multicavity laser chip 110' can be a GaN-based compound laser diode having an oscillation wavelength of 405 nm.

In the construction of FIG. 27, laser beams B' emitted from the light-emission points 110a of the multicavity laser chip 110' are collected by the condensing lens 120, and enter the core 130a of the multimode optical fiber 130. Then, the laser beams B' propagate in the multimode optical fiber 130, and are optically multiplexed into a single laser beam to be output.

The coupling efficiency of the laser beams B' to the multimode optical fiber 130 can be increased when the following conditions (1) and (2) are satisfied.

(1) The light-emission points 110a are arranged within a width approximately identical to the diameter of the core 130a of the multimode optical fiber 130.

(2) The condensing lens 120 is a convex lens having a focal length approximately identical to the diameter of the core 130a of the multimode optical fiber 130, or a rod lens which collimates the laser beams emitted from the multicavity laser chip 110' in only a plane perpendicular to the active layers in the multicavity laser chip 110'.

FIG. 28 is a plan view of an example of an optically-multiplexing laser-light source comprising a rod lens. The optically-multiplexing laser-light source of FIG. 28 comprises a laser array 140, a rod lens 113, a plurality of lens arrays 114, a condensing lens 120, and a multimode optical fiber 130.

In the laser array 140, a plurality (e.g., nine) of multicavity laser chips 110' each having a plurality (e.g., three) of light-emission points 110a' are fixedly arranged on a heat block 111 with equal spacings along the direction along which the plurality of light-emission points 110a' are aligned.

The plurality of lens arrays 114 are arranged in correspondence with the plurality of multicavity laser chips 110', respectively. Each of the plurality of lens arrays 114 has a plurality of microlenses corresponding to the plurality of light-emission points 110a' in one of the plurality of multicavity laser chips 110' corresponding to the lens array. The rod lens 113 is arranged between the plurality of multicavity laser chips 110' and the plurality of lens arrays 114.

In the optically-multiplexing laser-light source of FIG. 28, laser beams emitted from the light-emission points 110a' of the multicavity laser chips 110' are collected by the rod lens 113 in a predetermined direction, and collimated by the corresponding microlenses in the plurality of lens arrays 114. The collimated laser beams L are collected by the condensing lens 120, and enter the core 130a of the multimode optical fiber 130. Then, the laser beams propagate in the multimode optical fiber 130, and are optically multiplexed into a single laser beam to be output.

FIGS. 29A and 29B are plan and cross-sectional views of another example of an optically-multiplexing laser-light source. As illustrated in FIG. 29B, a heat block 182 having an L-shaped cross section parallel to the optical axis is mounted on a heat block 180 having an approximately rectangular cross section in a such a manner that a laser mounting space is provided between the heat blocks 180 and 182. The first half of a plurality (e.g., two) of multicavity laser chips 110" each having a plurality (e.g., five) of light-emission points 110a" are fixedly arranged on the heat block 182 with equal spacings along the direction along which the plurality of light-emission points 110a" are aligned.

The heat block 180 having an approximately rectangular cross section also has a concavity. The second half of the plurality (e.g., two) of multicavity laser chips 110" are fixedly arranged on the upper surface of the heat block 180 at identical horizontal positions to (exactly under) the first half of the plurality of multicavity laser chips 110".

A collimator-lens array 184 in which a plurality of collimator lenses are arranged in correspondence with the light-emission points 110a" of the first or second half of the plurality of multicavity laser chips 110" is arranged on the light-emission side of each of the first and second halves of the plurality of multicavity laser chips 110" so that the length direction of each collimator lens coincides with the direction of a greater spread of each laser beam (the direction of the fast axis), and the width direction of each collimator lens coincides with the direction of a smaller spread of each laser beam (the direction of the slow axis). Since the collimator lenses in each collimator-lens array 184 are integrally formed as the collimator-lens array as above, the space utilization efficiency of the laser light increases, and therefore the output power of the optically-multiplexing laser-light source increases. In addition, the number of parts and cost can be reduced.

Further, a condensing lens 120 and an optical fiber 130 are arranged on the light-emission side of the collimator-lens arrays 184, where the condensing lens 120 collects the laser beams which have been collimated by the collimator-lens arrays 184, and couples the collimated laser beams to the optical fiber 130.

In the optically-multiplexing laser-light source of FIGS. 29A and 29B, laser beams emitted from the light-emission points 110a" in the first and second halves of plurality of the multicavity laser chips 110" are collimated by the collimator-lens arrays 184 arranged in the upper and lower layers, are collected by the condensing lens 120, and enter the core 130a of the multimode optical fiber 130. Then, the laser beams propagate in the multimode optical fiber 130, and are optically multiplexed into a single laser beam to be output.

Thus, the above multi-layer arrangement of the multicavity laser chips and the integral formation of the collimator-lenses increase the output power of the optically-multiplexing laser-light source of FIGS. 29A and 29B. Since the optically-multiplexing laser-light source of FIGS. 29A and 29B can realize a fiber-array light source or a bundled-fiber-array light source having higher luminance, it is particularly preferable to use the optically-multiplexing laser-light source of FIGS. 29A and 29B as a constituent of a laser-light source in image exposure apparatuses according to the present invention.

In addition, it is possible to construct a laser module by setting each of the above optically-multiplexing laser-light sources in a casing, and leading a light-emission-end portion of the optical fiber 130 out of the casing.

Although, in the above embodiments, an optical fiber having a cladding diameter smaller than that of the multimode optical fiber and a core diameter identical to that of the multimode optical fiber is coupled to the light-emission end of the multimode optical fiber constituting the optically-multiplexing laser-light source in order to increase the luminance, alternatively, it is possible to use a multimode optical fiber having a cladding diameter of, for example, 125, 80, or 60 micrometers without coupling an optical fiber having a smaller cladding diameter to the light-emission end of the multimode optical fiber.

Although, in the above examples, the present invention is applied to the image forming apparatuses and method of forming an image, the present invention can be applied to other apparatuses such as a projector which projects an image on a screen. In such apparatuses, it is also possible to obtain the advantages of the present invention.

In addition, all of the contents of the Japanese patent applications Nos. 2002-287631 and 2002-287639 are incorporated into this specification by reference.

What is claimed is:

1. A method of forming an image, the method comprising:
individually modulating a plurality of portions of light applied to a spatial light-modulation element according to control signals, the spatial light-modulation element having a plurality of pixel portions which are two-dimensionally arranged;
applying the light to said spatial light-modulation element by a light source;
passing the plurality of portions of the light modulated by said plurality of pixel portions through a first image-forming optical system;
passing the plurality of portions of the light through a plurality of microlenses, the plurality of microlenses comprising a microlens array arranged in a vicinity of an image-forming plane of the first image-forming optical system, and the plurality of microlenses arranged in correspondence with the plurality of pixel portions, respectively;

passing the plurality of portions of the light, which have passed through the plurality of microlenses, through a second image-forming optical system; and forming, on a predetermined surface, an image represented by the plurality of portions of the light modulated by the spatial light-modulation element, wherein each of said first and second image-forming optical systems is a magnified-image-forming optical system which forms an image with a magnification power greater than one.

2. The method according to claim 1, wherein said light source comprises a plurality of laser units for generating a plurality of laser beams, wherein, in each of said laser units, a plurality of laser beams enters an optical fiber, and the optical fibers in the plurality of laser units are arranged to constitute a bundle.

3. The method according to claim 2, further comprising generating said plurality of laser beams using one or more multicavity semiconductor lasers provided in each of said plurality of laser units.

4. The method according to claim 2, further comprising generating said plurality of laser beams using a plurality of single-cavity semiconductor lasers provided in each of said plurality of laser units.

5. The method according to claim 1, wherein said spatial light-modulation element is a DMD (digital micromirror device).

6. A method of forming an image, the method comprising:

individually modulating a plurality of portions of light applied to a spatial light-modulation element according to control signals, the spatial light-modulation element having a plurality of pixel portions which are two-dimensionally arranged;

applying the light to said spatial light-modulation element by a light source;

passing the plurality of portions of the light modulated by said plurality of pixel portions through a first image-forming optical system;

passing the plurality of portions of the light through a plurality of microlenses, the plurality of microlenses comprising a microlens array arranged in an image-forming plane of the first image-forming optical system, and the plurality of microlenses arranged in correspondence with the plurality of pixel portions, respectively;

passing the plurality of portions of the light through an aperture array having a plurality of apertures respectively located at positions at which the plurality of portions of the light which have passed through said plurality of microlenses converge;

passing the plurality of portions of the light, which have passed through the plurality of apertures, through a second image-forming optical system; and forming, on a predetermined surface, an image represented by the plurality of portions of the light modulated by the spatial light-modulation element, wherein one of said microlens array and said aperture array has at least one protrusion toward the other of the microlens array and the aperture array, the at least one protrusion has a predetermined height in a direction of an optical axis, and a relative position between the microlens array and the aperture array is set by one of said microlens array and the aperture array abutting the at least one protrusion of the other of said microlens array and the aperture array.

7. The method according to claim 6, wherein each of said at least one protrusion has a top surface, said other of said microlens array and the aperture array has a surface which is in contact with the top surface of the at least one protrusion, and said surface of the other of said microlens array and the aperture array and the top surface of the at least one protrusion each have a flatness of 0.2 micrometers or smaller.

8. The method according to claim 6, wherein said light source comprises a plurality of laser units for generating a plurality of laser beams, wherein, in each of said laser units, a plurality of laser beams enters an optical fiber, and the optical fibers in the plurality of laser units are arranged to constitute a bundle.

9. The method according to claim 8, further comprising generating said plurality of laser beams using one or more multicavity semiconductor lasers provided in each of said plurality of laser units.

10. The method according to claim 8, further comprising generating said plurality of laser beams using a plurality of single-cavity semiconductor lasers provided in each of said plurality of laser units.

11. The method according to claim 6, wherein said spatial light-modulation element is a DMD (digital micromirror device).

12. A method of forming an image, said method comprising:

individually modulating a plurality of portions of light applied to a spatial light-modulation element according to control signals, the spatial light-modulation element having a plurality of pixel portions which are two-dimensionally arranged;

applying the light to said spatial light-modulation element by a light source;

passing the plurality of portions of the light modulated by said plurality of pixel portions through a first image-forming optical system;

passing the plurality of portions of the light through a plurality of microlenses, the plurality of microlenses comprising a microlens array arranged in an image-forming plane of the first image-forming optical system, and the plurality of microlenses arranged in correspondence with the plurality of pixel portions, respectively;

passing the plurality of portions of the light through an aperture array having a plurality of apertures respectively located at positions at which the plurality of portions of the light which have passed through said plurality of microlenses converge;

passing the plurality of portions of the light, which have passed through the plurality of apertures, through a second image-forming optical system; and forming, on a predetermined surface, an image represented by the plurality of portions of the light modulated by the spatial light-modulation element, wherein a relative position between said microlens array and said aperture array in a direction of an optical axis is set by joining the microlens array and the aperture array together through a spacer having a predetermined thickness.

13. The method according to claim 12, wherein said spacer has first and second surfaces which are respectively in contact with said microlens array and said aperture array, said microlens array has a third surface in contact with said first surface of the spacer, said aperture array has a fourth surface in contact with said second surface of the spacer, and the first, second, third, and fourth surfaces each have a flatness of 0.2 micrometers or smaller.

14. The method according to claim 12, wherein said light source comprises a plurality of laser units for generating a plurality of laser beams, wherein, in each of said laser units, a plurality of laser beams enters an optical fiber, and the optical fibers in the plurality of laser units are arranged to constitute a bundle.

15. The method according to claim 14, further comprising generating said plurality of laser beams using one or more multicavity semiconductor lasers provided in each of said plurality of laser units.

16. The method according to claim 14, further comprising generating said plurality of laser beams using a plurality of single-cavity semiconductor lasers provided in each of said plurality of laser units.

17. The method according to claim 12, wherein said spatial light-modulation element is a DMD (digital micromirror device).

* * * * *